United States Patent
Abe et al.

(10) Patent No.: US 7,733,145 B2
(45) Date of Patent: Jun. 8, 2010

(54) NONVOLATILE LATCH CIRCUIT AND NONVOLATILE FLIP-FLOP CIRCUIT

(75) Inventors: Keiko Abe, Yokohama (JP); Takahiro Hirai, Yokohama (JP); Shiho Nakamura, Fujisawa (JP); Hirofumi Morise, Yokohama (JP); Mototsugu Hamada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 11/848,864

(22) Filed: Aug. 31, 2007

(65) Prior Publication Data

US 2008/0080231 A1    Apr. 3, 2008

(30) Foreign Application Priority Data

Sep. 28, 2006    (JP)    ............................. 2006-264590

(51) Int. Cl.
   H03K 3/00    (2006.01)
   H03K 3/45    (2006.01)
(52) U.S. Cl. ........................................ 327/218; 327/225
(58) Field of Classification Search ................. 327/199, 327/200, 208–212, 215–218; 365/189.011, 365/189.08, 204, 209, 225.5
   See application file for complete search history.

(56) References Cited

U.S. PATENT DOCUMENTS

| 6,304,477 B1 | 10/2001 | Naji | |
| 6,894,549 B2 * | 5/2005 | Eliason | ........................ 327/217 |
| 6,944,050 B2 * | 9/2005 | Kang et al. | .................. 365/158 |
| 7,286,393 B2 * | 10/2007 | Hynes et al. | ................. 365/158 |

FOREIGN PATENT DOCUMENTS

| JP | 8-256044 | 10/1996 |
| JP | 2002-216468 | 8/2002 |
| JP | 2003-16773 | 1/2003 |
| JP | 2003-157671 | 5/2003 |
| JP | 2004-213860 | 7/2004 |
| JP | 2004-525473 | 8/2004 |
| JP | 2006-155870 | 6/2006 |

* cited by examiner

*Primary Examiner*—Lincoln Donovan
*Assistant Examiner*—Colleen O'Toole
(74) *Attorney, Agent, or Firm*—Oblon, Spivak, McClelland, Maier & Neustadt, L.L.P.

(57) ABSTRACT

A nonvolatile latch circuit includes: a first gate part controlling to load or intercept an input signal based on a gate signal; a first logic gate functioning as an inverter or a gate outputting a constant voltage in response to the first control signal; a second logic gate functioning as an inverter or a gate outputting the constant voltage in response to the first control signal; a second gate part controlling to load or intercept the output of the second logic gate based on an inverted signal of the gate signal and sends the output of the second logic gate to an first input terminal of the first logic gate; and first and second injection type MTJ elements provided between the driving power supply and the first and second logic gates and changing in resistance depending upon a current flow direction.

9 Claims, 20 Drawing Sheets

NONVOLATILE LATCH CIRCUIT AND NONVOLATILE FLIP-FLOP CIRCUIT

CROSS-REFERENCE TO RELATED APPLICATION

This application is based upon and claims the benefit of priority from prior Japanese Patent Application No. 2006-264590 filed on Sep. 28, 2006 in Japan, the entire contents of which are incorporated herein by reference.

BACKGROUND OF THE INVENTION

1. Field of the Invention

The present invention relates to a nonvolatile latch circuit and a nonvolatile flip-flop circuit.

2. Related Art

As the transistors become finer, not only the sub-threshold leak current but also the gate leak current increases and power dissipation caused by these leak currents occupies the greater part of the total power dissipation of the LSI. As for lowered powered dissipation at the circuit and system level, a technique of lowering the drive voltage and lowering the operation frequency as a basic principle has been proposed (see, for example, LongRun (January 2000) http://www.transmeta.com/index.html).

Aiming at further lowered power dissipation, a technique of dividing an LSI into several circuit blocks and intercepting power supply to blocks which are not in operation is proposed (see, for example, Shimizu, T.; Arakawa, F.; Kawahara, T.; VLSI Circuits, 2001. Digest of Technical Papers. 2001 Symposium on 14-16 Jun. 2001 Pages 55-56). Since this proposal cannot intercept the power supply for a block which is required to retain data, however, there is a problem that blocks to which the technique can be applied are restricted.

On the other hand, a technique of incorporating ferroelectric capacitors into a sequential circuit such as a flip-flop to form a nonvolatile sequential circuit is proposed (see, for example, JP-A 2000-124776, or Fujimori, Y.; Nakamura, T.; Takasu, H.; Technical Report of IEICE. ICD2002-10 Pages: 13-18). This nonvolatile sequential circuit stores data of 0 and 1 as a difference of remanent dielectric polarization of a ferroelectric capacitor before interception of the power supply. Even if the power supply is intercepted, the data is retained and the data can be read out after the power supply is connected again. If such a nonvolatile sequential circuit can be realized, the power supply can be intercepted inclusive of the sequential circuit at the time of non-operation and consequently a dramatic reduction of power dissipation can be anticipated. However, the nonvolatile sequential circuit has a problem of scalability that making the circuit fine reduces the readout margin because ferroelectric capacitors are used in storage elements.

Furthermore, in recent years, study of various nonvolatile memory elements using new materials and having a feature that the elements have two terminals and a silicon single crystal substrate is not needed is vigorously promoted. It is considered that those nonvolatile memory elements are small-sized and they can be incorporated into the wiring layer portion. Implementation of a small sized nonvolatile latch circuit using the nonvolatile memory element is proposed (see, for example, Keiko Abe, Shinobu Fujita, and Thomas H. Lee, EUROPEAN MICRO AND NANO SYSTEMS 2204, or U.S. Patent No. 2006/0083047). In Keiko Abe, Shinobu Fujita, and Thomas H. Lee, EUROPEAN MICRO AND NANO SYSTEMS 2004, a spin injection type MTJ (Magnetic Tunnel Junction) element which is excellent in scalability and high in endurance is mentioned as the nonvolatile memory element used for the nonvolatile latch.

When two nonvolatile latch circuits are connected to form a flip-flop, data is written into the storage element every clock period. If it is attempted to operate the flip-flop at an operation frequency of 1 GHz, the storage element is required to have high endurance amounting to $8.64\times10^{13}$ times a day. A nonvolatile latch circuit capable of satisfying such high endurance is not known.

SUMMARY OF THE INVENTION

The present invention has been made in view of these circumstances, and an object of thereof is to provide a nonvolatile latch circuit and a nonvolatile flip-flop circuit which are excellent in scalability even if they are made fine and which make high endurance unnecessary.

A nonvolatile latch circuit according to a first aspect of the present invention includes: an input node receiving an input signal; a first gate part controlling to load or intercept the input signal based on a gate signal; a first logic gate connected to a driving power supply and a grounding power supply, which has a first input terminal to receive the input signal and a second input terminal to receive a first control signal, and which functions as an inverter or a gate outputting a constant voltage in response to the first control signal; a second logic gate connected to the driving power supply and the grounding power supply, which has a first input terminal to receive the output of the first logic gate and a second input terminal to receive the first control signal, and which functions as an inverter or a gate outputting the constant voltage in response to the first control signal; a second gate part controlling to load or intercept the output of the second logic gate based on an inverted signal of the gate signal and sends the output of the second logic gate to the first input terminal of the first logic gate; first and second injection type MTJ elements provided between the driving power supply and the first and second logic gates and changing in resistance depending upon a current flow direction; first and second data write signal lines provided between the driving power supply and the first and second logic gates; a first output node outputting the output of the second logic gate as an output signal; and a second output node outputting the output of the first logic gate as an inverted signal of the output signal.

A nonvolatile latch circuit according to a second aspect of the present invention includes: an input node receiving an input signal; a first gate part controlling to load or intercept the input signal based on a gate signal; a first logic gate connected to a driving power supply and a grounding power supply, which has a first input terminal to receive the input signal and a second input terminal to receive a first control signal, and which functions as an inverter or a gate outputting a constant voltage in response to the first control signal; a second logic gate connected to the driving power supply and the grounding power supply, which has a first input terminal to receive the output of the first logic gate and a second input terminal to receive the first control signal, and which functions as an inverter or a gate outputting the constant voltage in response to the first control signal; a second gate part controlling to load or intercept the output of the second logic gate based on an inverted signal of the gate signal and sends the output of the second logic gate to the first input terminal of the first logic gate; first and second injection type MTJ elements provided between the grounding power supply and the first and second logic gates and changing in resistance depending upon a current flow direction; first and second data write signal lines provided between the grounding power supply and the first and second logic gates; a first output node outputting the output of the second logic gate as an output signal; and a second output node outputting the output of the first logic gate as an inverted signal of the output signal.

A nonvolatile flip-flop circuit according to a third aspect of the present invention includes: the nonvolatile latch circuit described above.

DETAILED DESCRIPTION OF THE INVENTION

Hereafter, embodiments of the present invention will be described in detail with reference to the drawings.

First Embodiment

Figure 1:
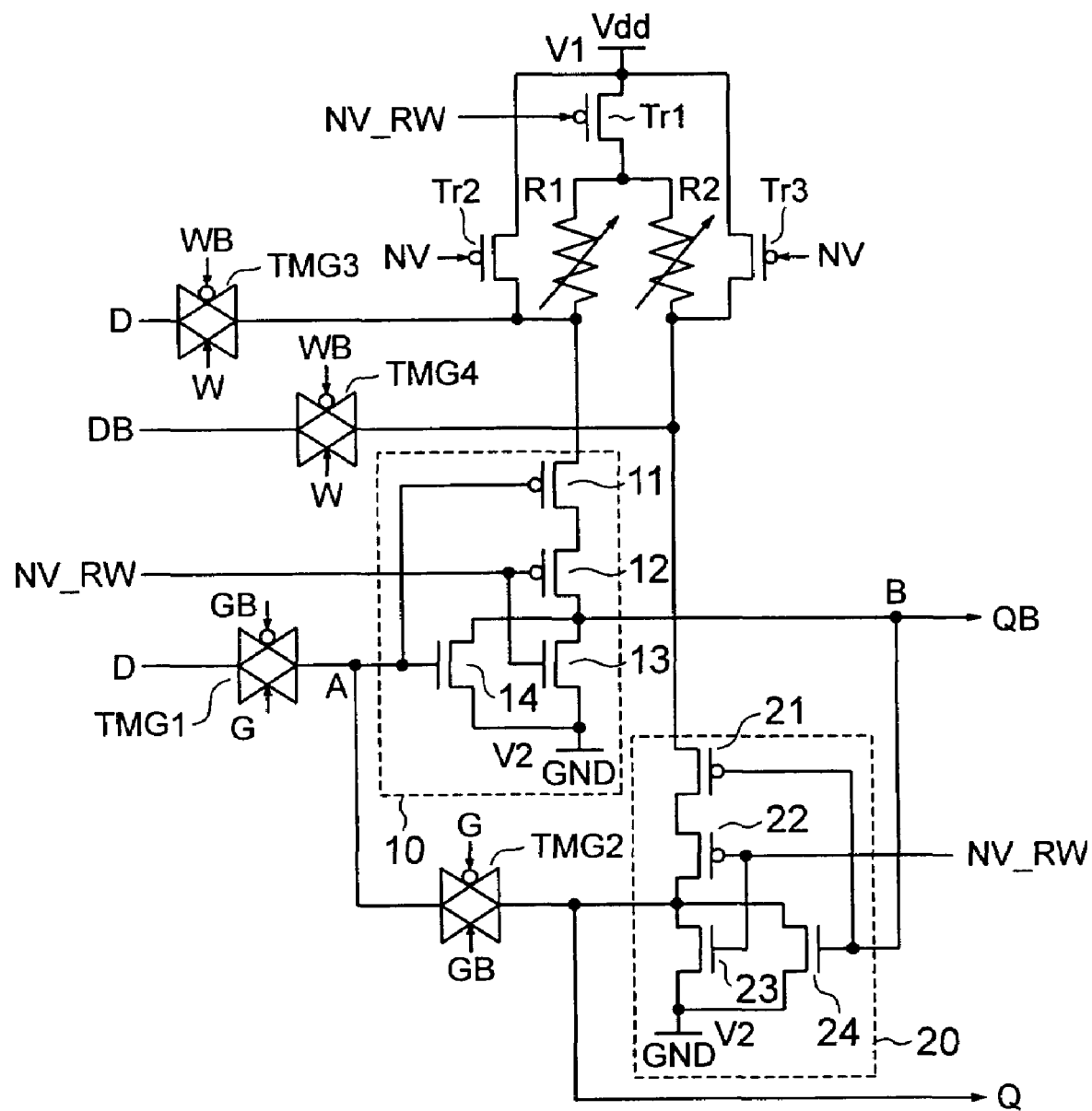
FIG. 1 is a circuit diagram showing a nonvolatile latch circuit according to a first embodiment.

A nonvolatile latch circuit according to a first embodiment of the present invention is shown in FIG. 1. The nonvolatile latch circuit according to the present embodiment includes logic circuits 10 and 20, spin injection type MTJ (Magnetic Tunnel Junction) elements R1 and R2, p-channel transistors Tr1, Tr2 and Tr3, and transmission gates TMG1, TMG2, TMG3 and TMG4.

The logic circuits 10 and 20 are configured so as to output a definite logic value ("0" in the present embodiment) or operate as an inverter according to a control signal NV_RW.

In a specific example of the logic circuit 10, a series circuit composed of p-channel transistors 11 and 12 connected in series and a parallel circuit composed of n-channel transistors 13 and 14 connected in parallel are connected in series. Gates of the p-channel transistor 12 and the n-channel transistor 13 are connected in common to receive the control signal NV_RW. Gates of the p-channel transistor 11 and the n-channel transistor 14 are connected in common to serve as an input terminal of the logic circuit 10. Drains of the p-channel transistor 12 and the n-channel transistor 13 connected in common serve as an output terminal of the logic circuit 10. Sources of the n-channel transistors 13 and 14 are connected to a grounding power supply GND.

In the same way, in a specific example of the logic circuit 20, a series circuit composed of p-channel transistors 21 and 22 connected in series and a parallel circuit composed of n-channel transistors 23 and 24 connected in parallel are connected in series. Gates of the p-channel transistor 22 and the n-channel transistor 23 are connected in common to receive the control signal NV_RW. Gates of the p-channel transistor 21 and the n-channel transistor 24 are connected in common to serve as an input terminal of the logic circuit 20. Drains of the p-channel transistor 22 and the n-channel transistor 23 connected in common serve as an output terminal of the logic circuit 20. Sources of the n-channel transistors 23 and 24 are connected to a grounding power supply GND.

Therefore, the logic circuits 10 and 20 output "0" when the value of the control signal NV_RW is "1." When the control signal NV_RW is "0," the logic circuits 10 and 20 function as inverters. If the control signal NV_RW is regarded as an input signal, the logic circuits 10 and 20 function as NOR circuits.

In the present embodiment, the input terminal of the logic circuit 10 receives a data input D via the transmission gate TMG1. The output terminal of the logic circuit 10 is connected to the input terminal of the logic circuit 20. The output terminal of the logic circuit 20 is connected to the input terminal of the logic circuit 10 via the transmission gate TMG2. In other words, the logic circuits 10 and 20 are cross-coupled.

Each of the spin injection type MTJ elements R1 and R2 has a configuration including a magnetization pinned layer which has a ferromagnetic layer pinned in magnetization direction, a magnetization free layer which has a ferromagnetic layer which changes in magnetization direction, and a tunnel insulation film provided between the magnetization pinned layer and the magnetization free layer. Depending upon the direction flow of the current, the magnetization direction of the magnetization free layer becomes parallel to (the same direction as) the magnetization direction of the magnetization pinned layer or becomes anti-parallel to (opposite to) the magnetization direction of the magnetization pinned layer. Each of the spin injection type MTJ elements R1 and R2 is a nonvolatile memory which thus changes in resistance value.

A first end of the spin injection type MTJ element R1 is connected to the p-channel transistor 11 in the logic circuit 10 at its source. A second end of the spin injection type MTJ element R1 is connected to a power supply Vdd via the p-channel transistor Tr1. A first end of the spin injection type MTJ element R2 is connected to the p-channel transistor 21 in the logic circuit 20 at its source. A second end of the spin injection type MTJ element R2 is connected to the power supply Vdd via the p-channel transistor Tr1. The p-channel transistor Tr1 receives the control signal NV_RW at its gate, and short-circuits the second terminals of the spin injection type MTJ elements R1 and R2 to the power supply Vdd.

A first end of the p-channel transistor Tr2 is connected to the power supply Vdd, and a second end of the p-channel transistor Tr2 is connected to the first end of the spin injection type MTJ element R1. A first end of the p-channel transistor Tr3 is connected to the power supply Vdd, and a second end of the p-channel transistor Tr3 is connected to the first end of the spin injection type MTJ element R2. The p-channel transistors Tr2 and Tr3 receive a control signal NV at their gates. Therefore, the p-channel transistors Tr2 and Tr3 short-circuit the first ends of the spin injection type MTJ elements R1 and R2 to the power supply Vdd.

A data input D is input to a common connection node of the first end of the spin injection type MTJ element R1 and the source of the p-channel transistor 11 in the logic circuit 10 via the transmission gate TMG3. An inverted data DB is input to a common connection node of the first end of the spin injection type MTJ element R2 and the source of the p-channel transistor 21 in the logic circuit 20 via the transmission gate TMG4.

The nonvolatile latch circuit in the present embodiment having such a configuration becomes a nonvolatile D latch in which the latch operation is controlled by control signals G and GB input to the transmission gates TMG1 and TMG2 and memory read/write operation which becomes nonvolatile operation is controlled by the control signals NV_RW, and NV and a control signal W. The output of the logic circuit 20 becomes an output Q, and the output of the logic circuit 10 becomes an inverted output QB.

Specific operation in the present embodiment will now be described.

Figure 2:
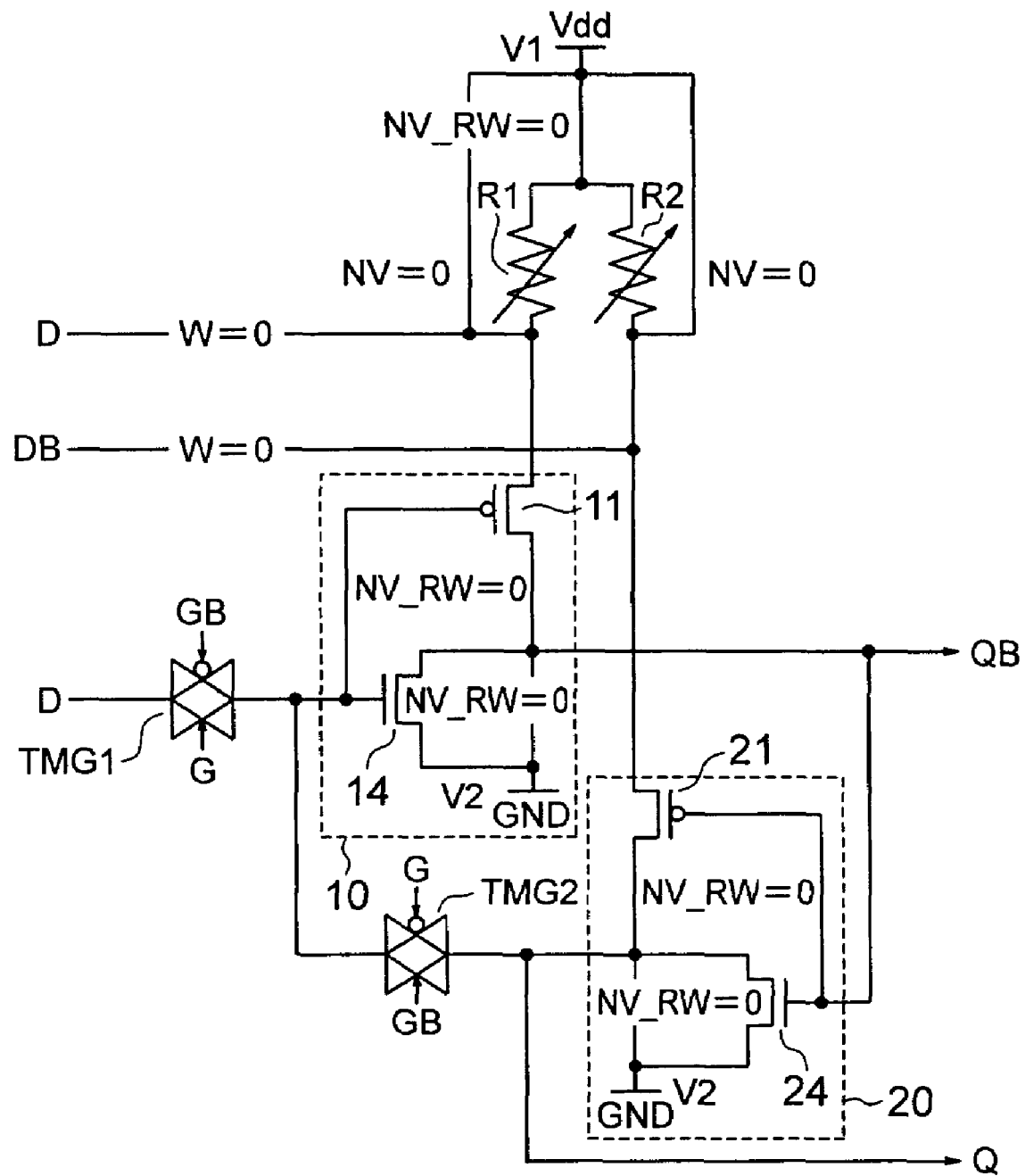
FIG. 2 is a circuit diagram showing a state in which operation of a nonvolatile D latch is performed in the first embodiment.

When the control signals for the nonvolatile D latch are NV_RW=0, NV=0 and W=0, the p-channel transistors Tr1, Tr2, Tr3, 12 and 22 turn on and the n-channel transistors 13 and 23 turn off, resulting in a state shown in FIG. 2.

The nonvolatile D latch disclosed in Keiko Abe, Shinobu Fujita, and Thomas H. Lee, EUROPEAN MICRO AND NANO SYSTEMS 2004 has a mechanism of performing writing or reading whenever a CLK signal changes in the latch operation. Therefore, there is a problem that the latch operation speed becomes slow according to the writing or reading speed of the memory element.

In the present embodiment, however, writing or reading is not performed on the memory elements R1 and R2 in the latch operation. In addition, the propagation delay of the power supply can be held down to a low value by keeping on-resistances of the p-channel transistors Tr2 and Tr3 lower than resistance values of the spin injection type MTJ elements R1 and R2. Therefore, the nonvolatile latch circuit in the present embodiment can be made to operate at a speed equivalent to that of the conventional D latch.

Figure 3:
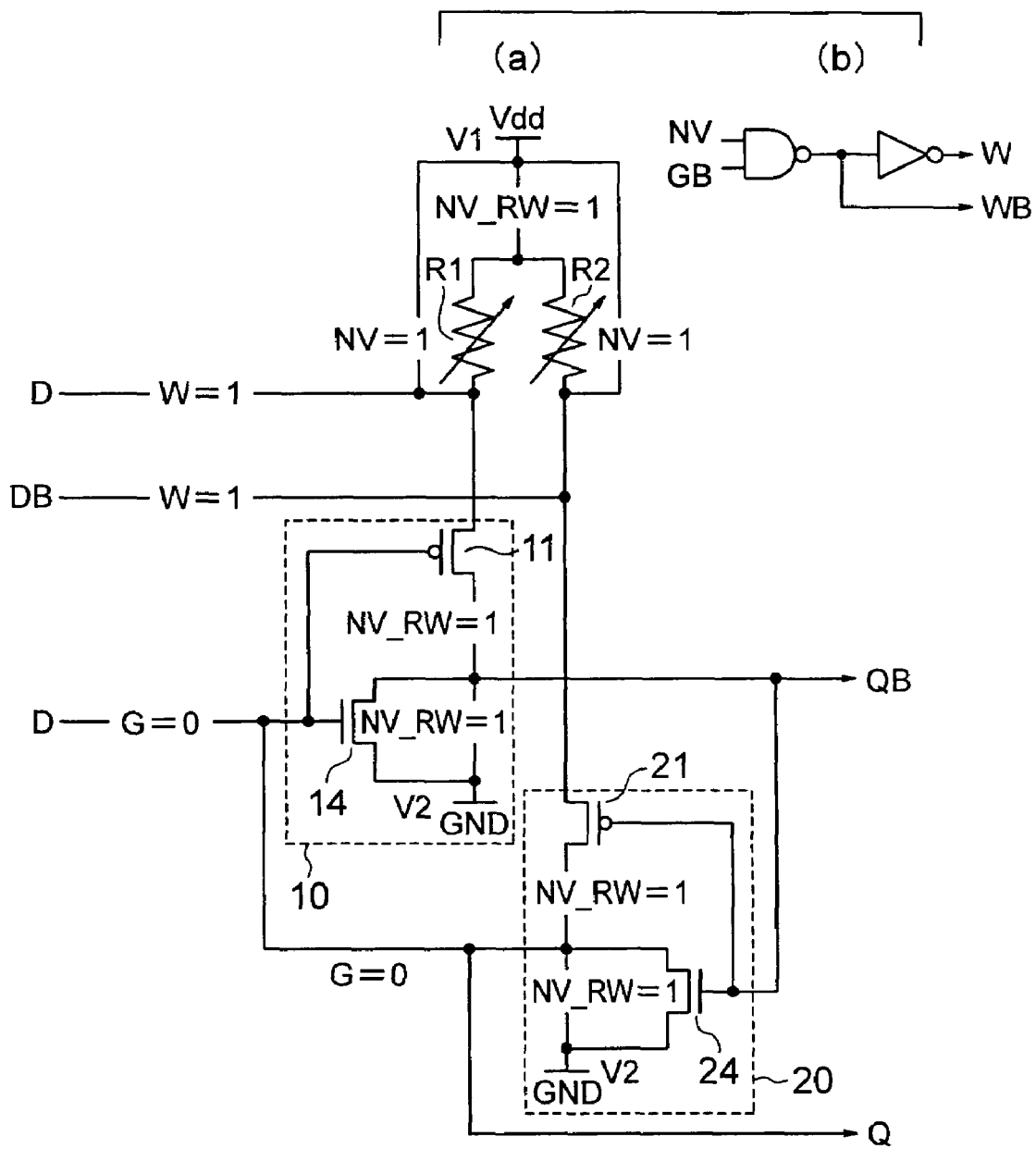
FIGS. 3(a) and 3(b) are circuit diagrams showing a state in which write operation is performed in the first embodiment.
Figure 4:
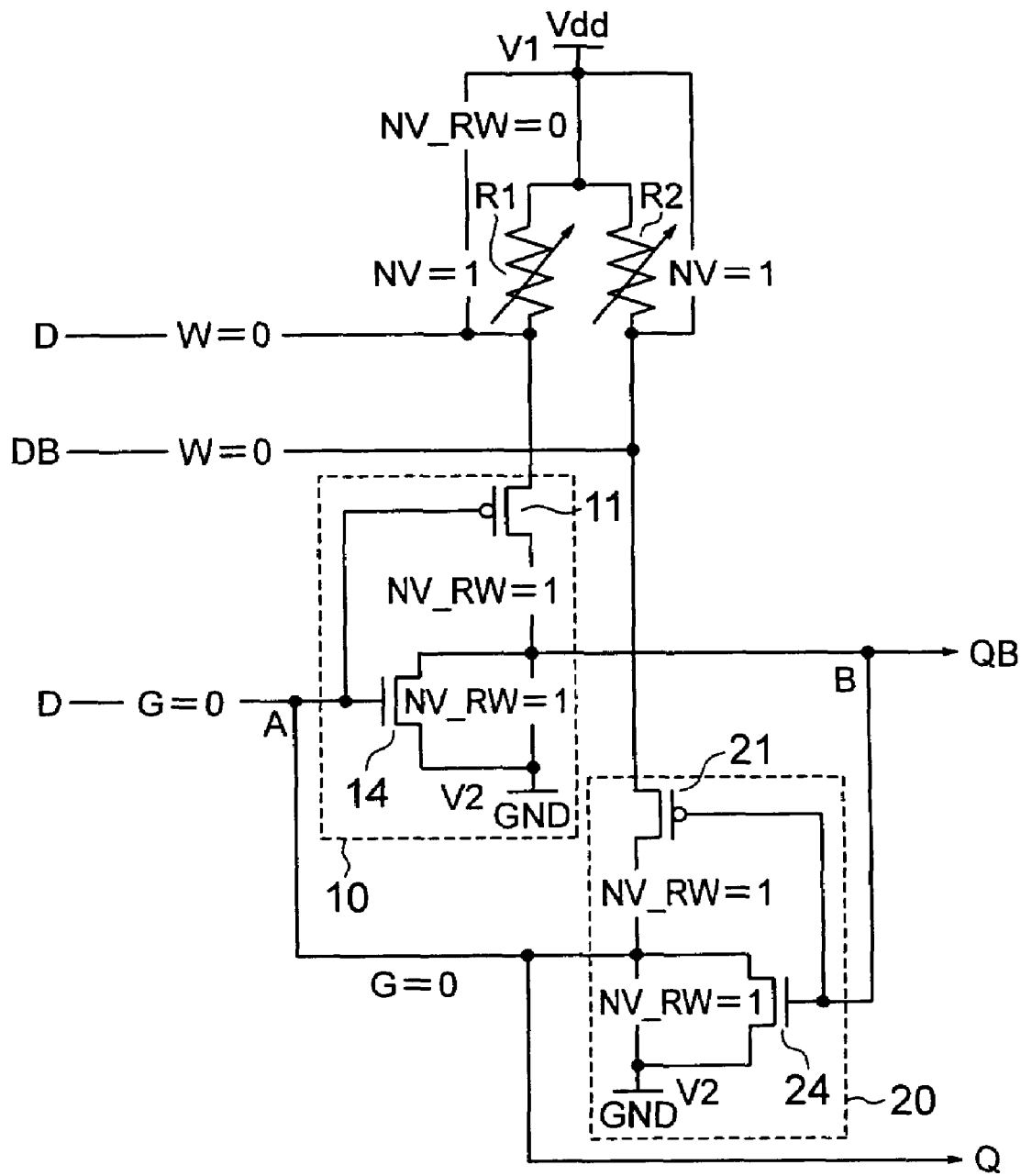
FIG. 4 is a circuit diagram showing a state in which precharge operation is performed in the first embodiment.

When writing the current data, the control signals are set to NV_RW=1, NV=1 and W=1 as shown in FIG. 3(a). In this state, the p-channel transistors Tr1, Tr2, Tr3, 12 and 22 turn off, and the n-channel transistors 13 and 23 turn off. As a result, currents in opposite directions flow through the spin injection type MTJ elements R1 and R2 according to the value of the input data D, and resistance values of the spin injection type MTJ elements R1 and R2 change to different values. Since the resistance values are retained by the nonvolatility of the spin injection type MTJ elements, data is not lost even if the power supply of the latch is intercepted.

Whether the control signal G is "1" or "0," the write operation can be performed. If the write operation is restricted to when G=0, however, it is possible to compose the control signal W input to the transmission gates TMG3 and TMG4 by using the control signals NV and GB as shown in FIG. 3(b).

Operation of reading out stored data is performed in two stages 1) precharge operation and 2) read operation after power is turned on. Since the nonvolatile D latch disclosed in Keiko Abe, Shinobu Fujita, and Thomas H. Lee, EUROPEAN MICRO AND NANO SYSTEMS 2004 has no precharge mechanism, there is a possibility that an error will occur in data readout.

First, 1) when precharging, the control signals are set to NV_RW=1, NV=1, G=0 and W=0. In this state, the p-channel transistors Tr1, Tr2, Tr3, 12 and 22 turn off and the n-channel transistors 13 and 23 turn on. Therefore, the outputs of the logic circuits 10 and 20 become "0." Both nodes A and B of the cross-coupled logic circuits 10 and 20 are precharged to "0" equally.

Figure 5:
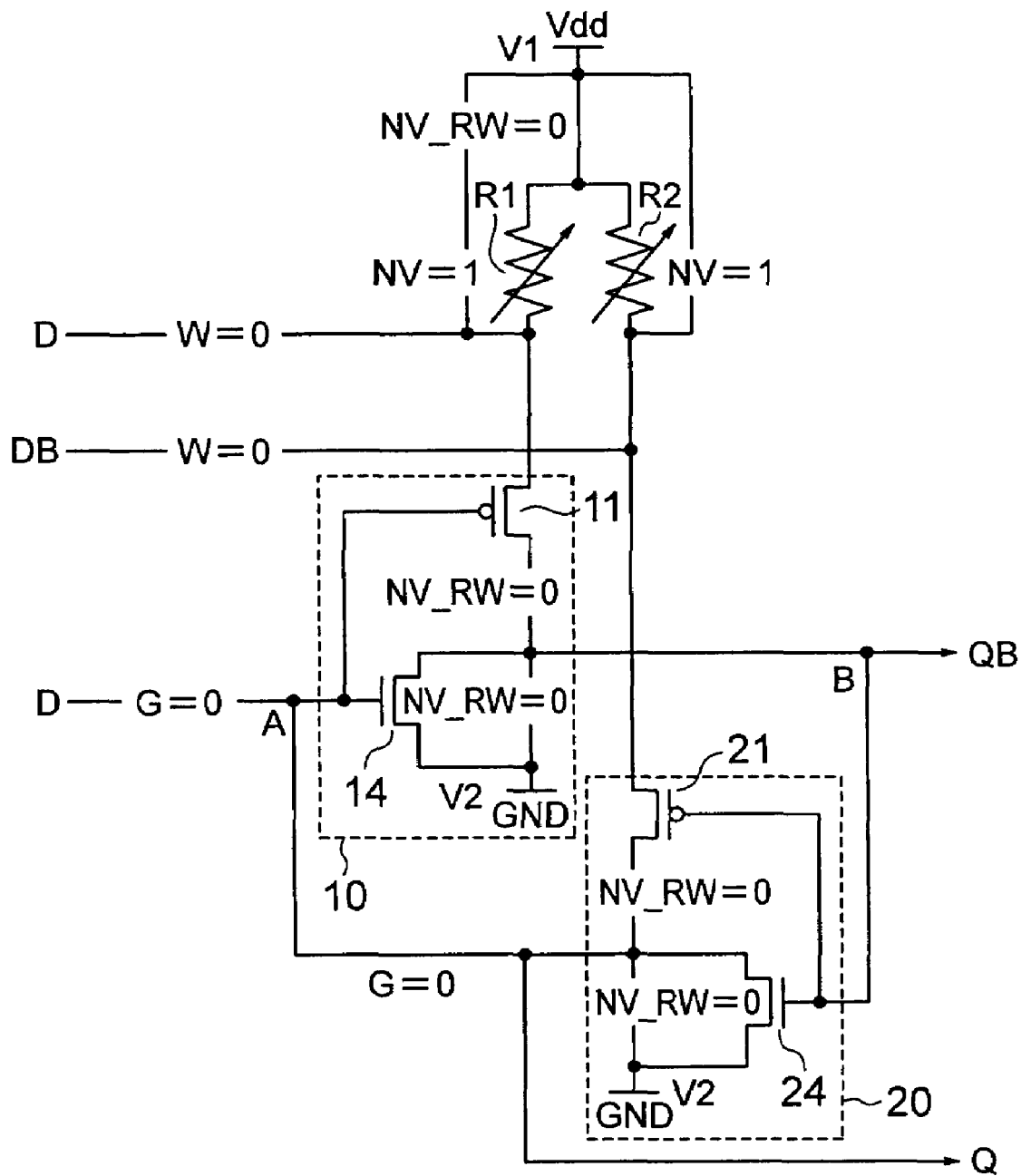
FIG. 5 is a circuit diagram showing a state in which read operation is performed in the first embodiment.

Subsequently, as 2) the read operation, only the control signal NV_RW is changed in state from "1" to "0" as shown in FIG. 5. Thereupon, the cross-coupled logic circuits 10 and 20 perform operation of the cross-coupled inverters. The values of the nodes A and B of the cross-coupled logic circuits 10 and 20 are determined to be "1" or "0" by a difference between delays depending upon the resistance values of the spin injection type MTJ elements R1 and R2. The values of the nodes A and B correspond to the stored states Q and QB. Therefore, the data readout errors can be reduced by having the precharge function.

As heretofore described, the present embodiment has the spin injection type MTJ elements as the nonvolatile memory elements. As a result, the nonvolatile latch circuit which is excellent in scalability even if it is made fine can be obtained. In addition, the data writing is not performed every clock period, but performed on the basis of the control signal. Therefore, high endurance becomes unnecessary.

Furthermore, since the transistors Tr1, Tr2 and Tr3 are provided in the present embodiment, lowering in the operation frequency can be suppressed.

Second Embodiment

Figure 6:
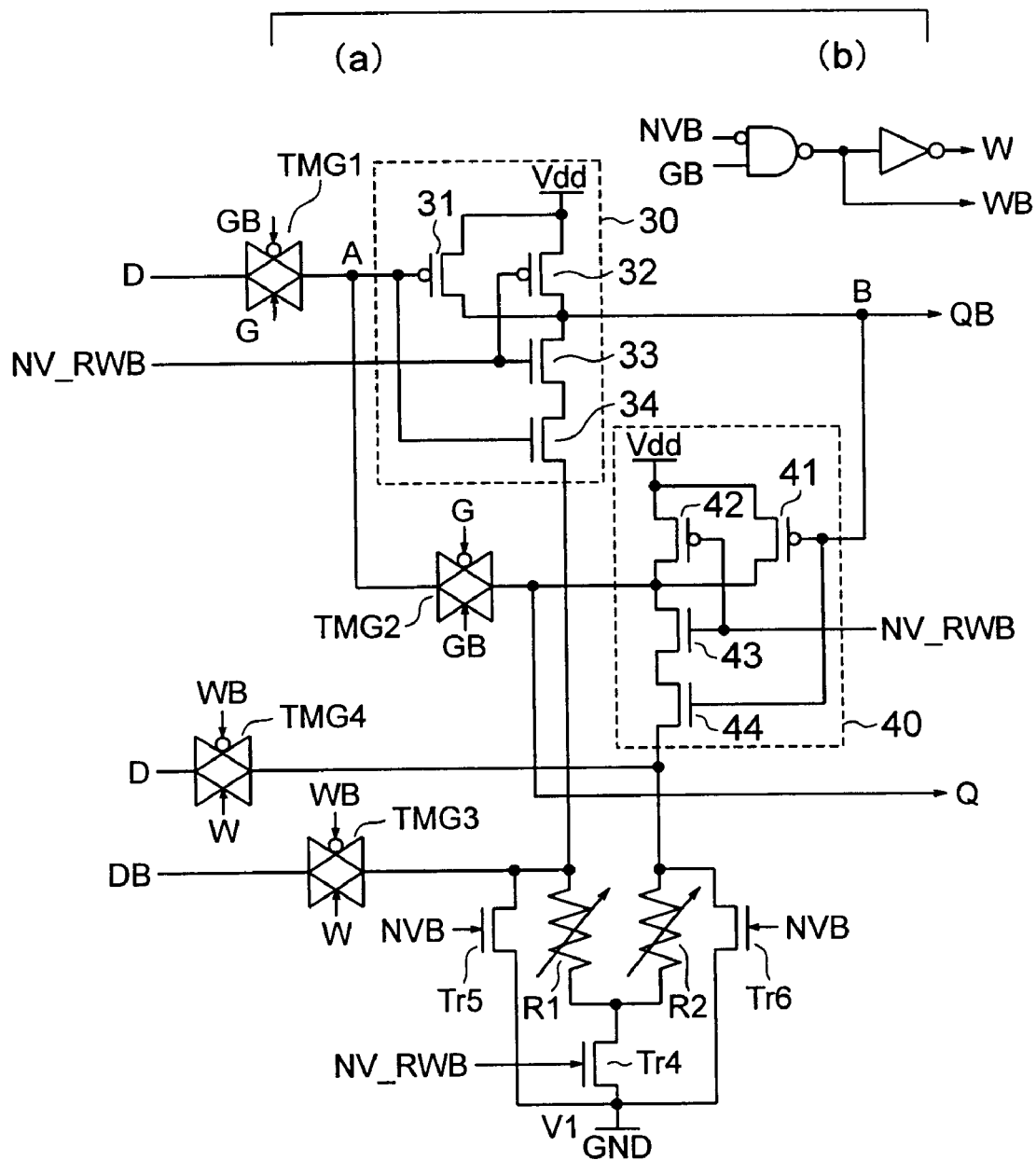
FIGS. 6(a) and 6(b) are circuit diagrams showing a nonvolatile latch circuit according to a second embodiment.

A nonvolatile latch circuit according to a second embodiment of the present invention is shown in FIG. 6(a). The nonvolatile latch circuit according to the present embodiment includes logic circuits 30 and 40, spin injection type MTJ (Magnetic Tunnel Junction) elements R1 and R2, n-channel transistors Tr4, Tr5 and Tr6, and transmission gates TMG1, TMG2, TMG3 and TMG4.

The logic circuits 30 and 40 are configured so as to output a definite logic value ("1" in the present embodiment) or operate as an inverter according to a control signal NV_RWB.

In a specific example of the logic circuit 30, a parallel circuit composed of p-channel transistors 31 and 32 connected in parallel and a series circuit composed of n-channel transistors 33 and 34 connected in series are connected in series. Gates of the p-channel transistor 32 and the n-channel transistor 33 are connected in common to receive the control signal NV_RWB. Gates of the p-channel transistor 31 and the n-channel transistor 34 are connected in common to serve as an input terminal of the logic circuit 30. Drains of the p-channel transistor 32 and the n-channel transistor 33 connected in common serve as an output terminal of the logic circuit 30. Sources of the p-channel transistors 31 and 32 are connected to a power supply Vdd.

In the same way, in a specific example of the logic circuit 40, a parallel circuit composed of p-channel transistors 41 and 42 connected in parallel and a series circuit composed of n-channel transistors 43 and 44 connected in series are connected in series. Gates of the p-channel transistor 42 and the n-channel transistor 43 are connected in common to receive the control signal NV_RWB. Gates of the p-channel transistor 41 and the n-channel transistor 44 are connected in common to serve as an input terminal of the logic circuit 40. Drains of the p-channel transistor 42 and the n-channel transistor 43 connected in common serve as an output terminal of the logic circuit 40. Sources of the p-channel transistors 41 and 42 are connected to the power supply Vdd.

Therefore, the logic circuits 30 and 40 function as inverters when the value of the control signal NV_RWB is "1." When the control signal NV_RWB is "0," the logic circuits 30 and 40 output "1." If the control signal NV_RWB is regarded as an input signal, the logic circuits 30 and 40 function as a NAND circuit.

In the present embodiment, the input terminal of the logic circuit 30 receives a data input D via the transmission gate TMG1. The output terminal of the logic circuit 30 is connected to the input terminal of the logic circuit 40. The output terminal of the logic circuit 40 is connected to the input terminal of the logic circuit 30 via the transmission gate TMG2. In other words, the logic circuits 30 and 40 are cross-coupled.

A first end of the spin injection type MTJ element R1 is connected to the n-channel transistor 34 in the logic circuit 30 at its source. A second end of the spin injection type MTJ element R1 is connected to a grounding power supply GND via the n-channel transistor Tr4. A first end of the spin injection type MTJ element R2 is connected to the n-channel transistor 44 in the logic circuit 40 at its source. A second end of the spin injection type MTJ element R2 is connected to the grounding power supply GND via the n-channel transistor Tr4. The n-channel transistor Tr4 receives the control signal NV_RWB at its gate, and short-circuits the second terminals of the spin injection type MTJ elements R1 and R2 to the grounding power supply.

A first end of the n-channel transistor Tr5 is connected to the grounding power supply GND, and a second end of the n-channel transistor Tr5 is connected to the first end of the spin injection type MTJ element R1. A first end of the n-channel transistor Tr6 is connected to the grounding power supply GND, and a second end of the n-channel transistor Tr6 is connected to the first end of the spin injection type MTJ element R2. The n-channel transistors Tr5 and Tr6 receive a control signal NVB at their gates. Therefore, the n-channel transistors Tr5 and Tr6 short-circuit the first ends of the spin injection type MTJ elements R1 and R2 to the grounding power supply.

An inverted data input DB is input to a common connection node of the first end of the spin injection type MTJ element R1 and the source of the n-channel transistor 34 in the logic circuit 30 via the transmission gate TMG3. A data input D is input to a common connection node of the first end of the spin injection type MTJ element R2 and the source of the n-channel transistor 44 in the logic circuit 40 via the transmission gate TMG4.

The nonvolatile latch circuit in the present embodiment having such a configuration becomes a nonvolatile D latch in which the latch operation is controlled by control signals G and GB input to the transmission gates TMG1 and TMG2 and memory read/write operation which becomes nonvolatile operation is controlled by the control signals NV_RWB, and NVB and a control signal W. The output of the logic circuit 40 becomes an output Q, and the output of the logic circuit 30 becomes an inverted output QB.

Specific operation in the present embodiment will now be described.

When the control signals are NV_RWB=1, NV=0 (NVB=1) and W=0, the nonvolatile D latch in the present embodiment functions as a D latch similar to the conventional latch.

When storing the current data, the control signals are set to NV_RWB=0, NV=1, G=0 and W=1. In this state, currents in opposite directions flow through the spin injection type MTJ elements R1 and R2 according to the value of the input data D, and resistance values of the spin injection type MTJ elements R1 and R2 change to different values. Since the resistance values are retained by the nonvolatility of the spin injection type MTJ elements R1 and R2, data is not lost even if the power supply of the latch is intercepted. Whether the control signal G is "1" or "0," the write operation can be performed. If the write operation is restricted to when G=0, however, it is possible to compose the control signal W input to the transmission gates TMG3 and TMG4 by using the control signals NVB and GB as shown in FIG. 6(b).

Operation of reading out stored data is performed in two stages 1) precharge operation and 2) read operation after power is turned on.

First, as 1) precharge operation, the control signals are set to NV_RWB=0, NV=1, G=0 and W=0. In this state, the outputs of the logic circuits 30 and 40 become "1." Both nodes A and B of the cross-coupled NANDs are precharged to "1" equally.

Subsequently, as 2) the read operation, only the control signal NV_RWB is changed in state from "1" to "0." Thereupon, the cross-coupled logic circuits 30 and 40 perform operation of the cross-coupled inverters. The values of the nodes A and B of the cross-coupled logic circuits 30 and 40 are determined to be "1" or "0" by a difference between delays depending upon the resistance values of the spin injection type MTJ elements R1 and R2. The values of the nodes A and B correspond to the stored states Q and QB.

As heretofore described, the present embodiment has the spin injection type MTJ elements as the nonvolatile memory elements. As a result, the nonvolatile latch circuit which is excellent in scalability even if it is made fine can be obtained. In addition, the data writing is not performed every clock period, but performed on the basis of the control signal. Therefore, high endurance becomes unnecessary.

Furthermore, since the transistors Tr4, Tr5 and Tr6 are provided in the present embodiment, lowering in the operation frequency can be suppressed.

Third Embodiment

Figure 7:
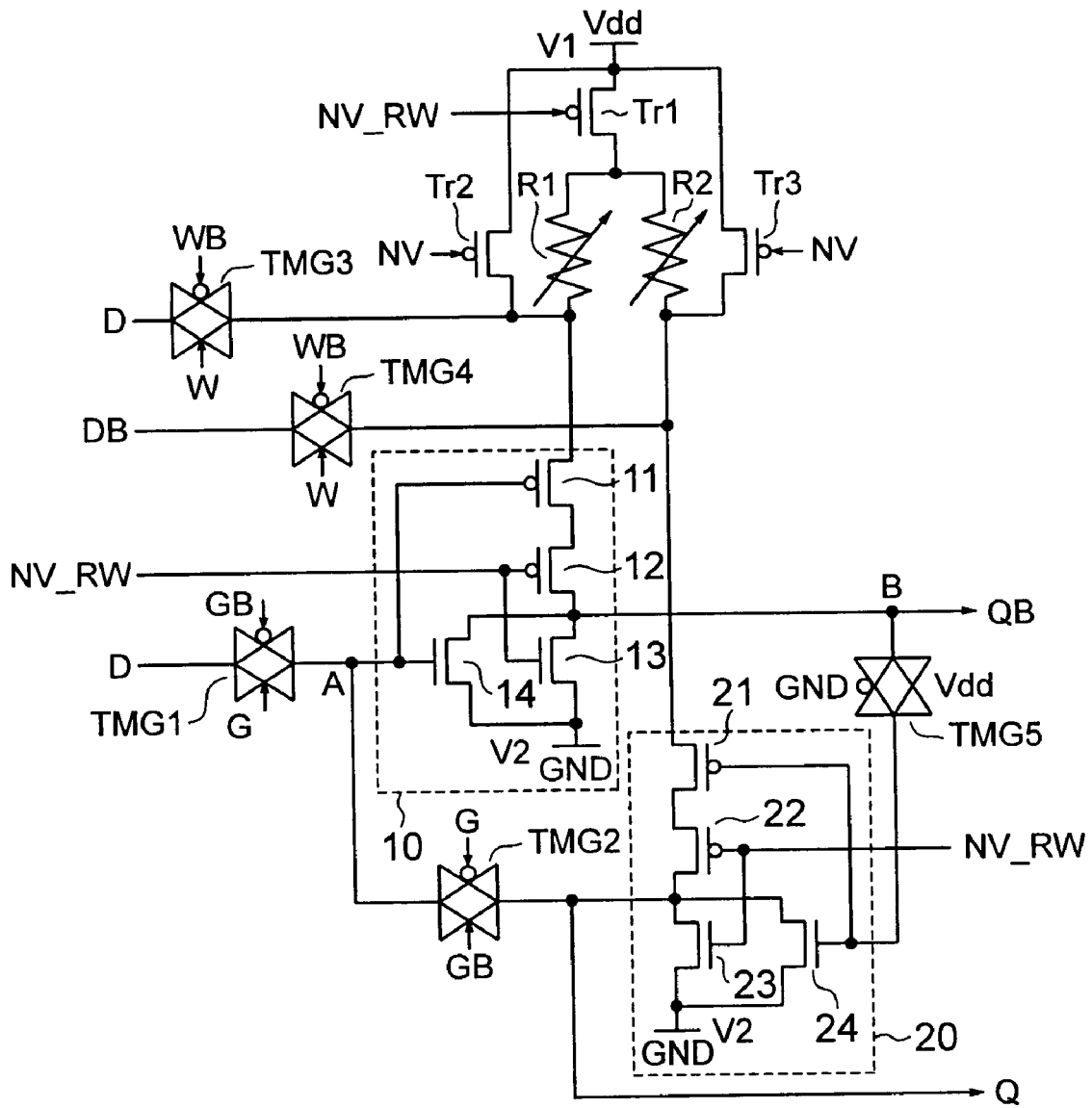
FIG. 7 is a circuit diagram showing a nonvolatile latch circuit according to a third embodiment.

A nonvolatile latch circuit according to a third embodiment of the present invention is shown in FIG. 7. The nonvolatile latch circuit according to the present embodiment has a configuration obtained from the nonvolatile latch circuit according to the first embodiment shown in FIG. 1 by disposing a transmission gate TMG5 having the same size as that of the transmission gate TMG2 between the output of the logic circuit 10 and the input of the logic circuit 20 in order to attain impedance matching between nodes located on the left and right sides of the cross-coupled logic circuits 10 and 20.

Owing to such a configuration, it becomes easy to read out a difference in resistance value between the spin injection type MTJ elements R1 and R2. GND or Vdd is connected to gates of the transmission gate TMG5 so as to always bring the transmission gate TMG5 into the ON state.

In the present embodiment as well, the nonvolatile latch circuit which is excellent in scalability even if it is made fine can be obtained and high endurance becomes unnecessary, in the same way as the first embodiment as heretofore described.

Fourth Embodiment

Figure 8:
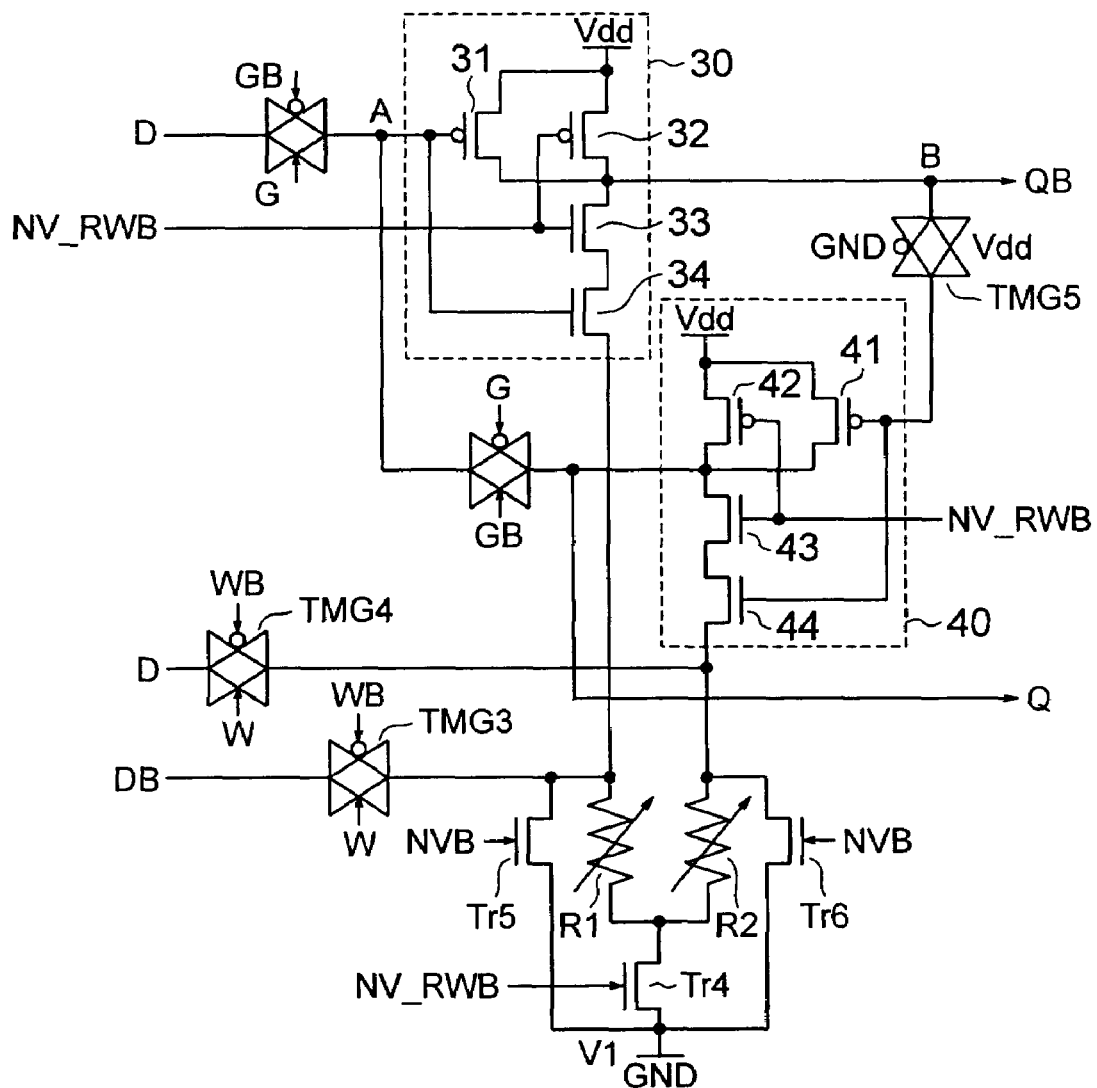
FIG. 8 is a circuit diagram showing a nonvolatile latch circuit according to a fourth embodiment.

A nonvolatile latch circuit according to a fourth embodiment of the present invention is shown in FIG. 8. The nonvolatile latch circuit according to the present embodiment has a configuration obtained from the nonvolatile latch circuit according to the second embodiment shown in FIG. 6(a) by disposing a transmission gate TMG5 having the same size as that of the transmission gate TMG2 between the output of the logic circuit 30 and the input of the logic circuit 40 in order to attain impedance matching between nodes located on the left and right sides of the cross-coupled logic circuits 30 and 40.

Owing to such a configuration, it becomes easy to read out a difference in resistance value between the spin injection type MTJ elements R1 and R2. GND or Vdd is connected to gates of the transmission gate TMG5 so as to always bring the transmission gate TMG5 into the ON state.

In the present embodiment as well, the nonvolatile latch circuit which is excellent in scalability even if it is made fine can be obtained and high endurance becomes unnecessary, in the same way as the second embodiment as heretofore described.

Fifth Embodiment

Figure 9:
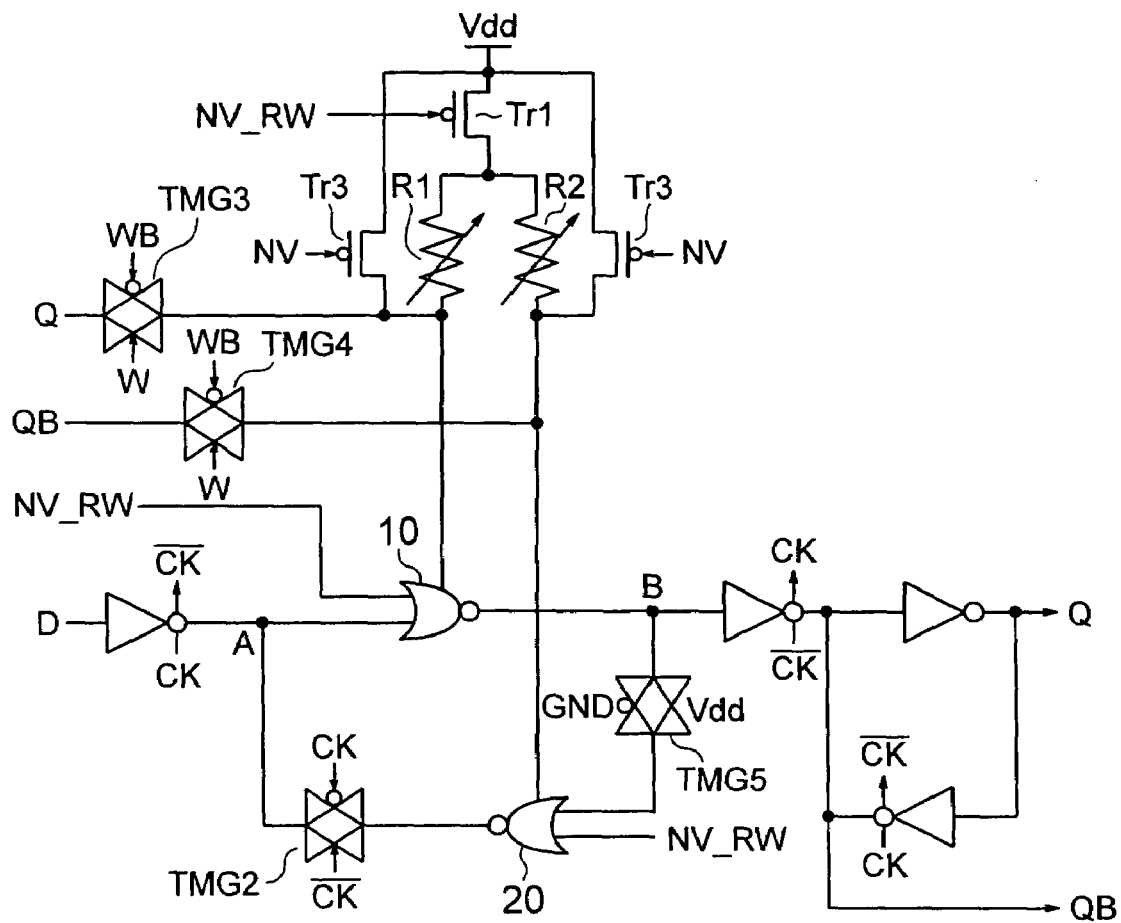
FIG. 9 is a circuit diagram showing a nonvolatile flip-flop circuit according to a fifth embodiment.

A nonvolatile flip-flop circuit according to a fifth embodiment of the present invention is shown in FIG. 9. The nonvolatile flip-flop circuit according to the present embodiment has a configuration obtained by replacing the D latch on the master side in the master-slave D flip-flop with the nonvolatile latch circuit according to the third embodiment shown in FIG. 7.

Figure 10:
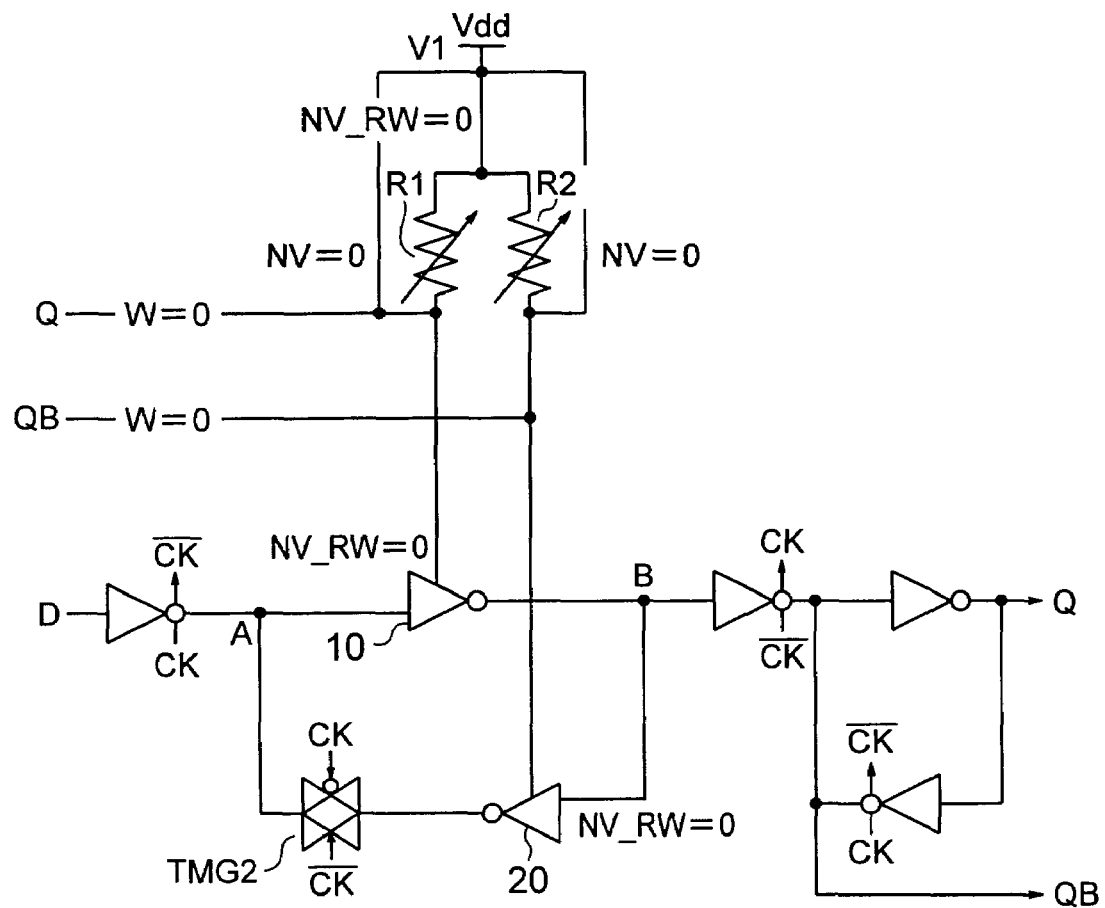
FIG. 10 is a circuit diagram showing a state in which operation of a nonvolatile D latch is performed in the fifth embodiment.
Figure 11:
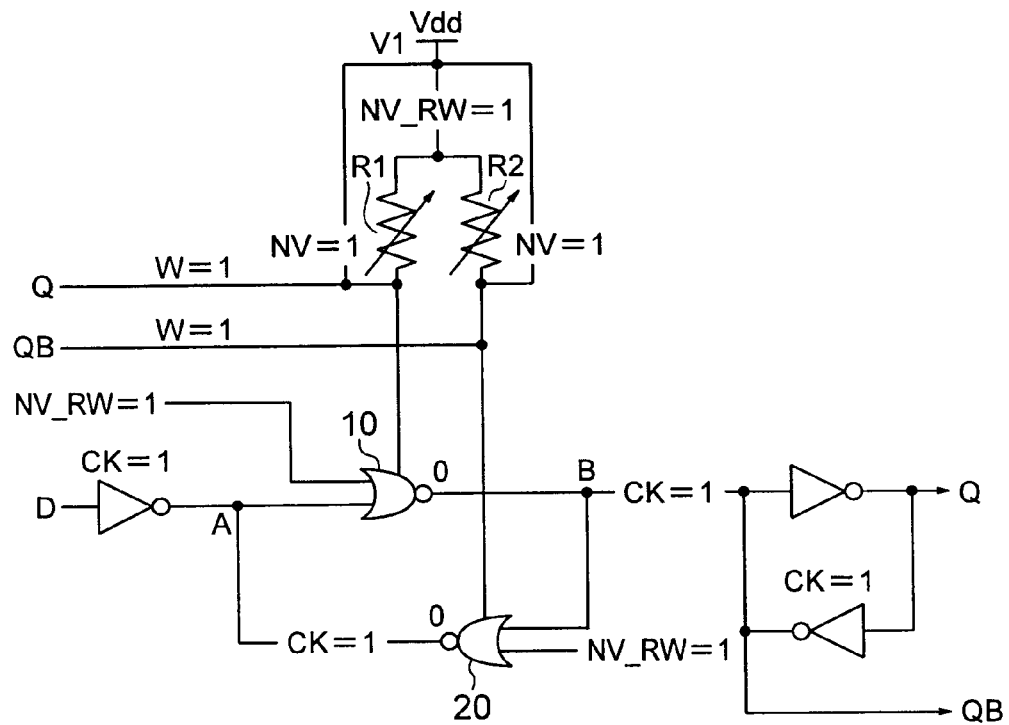
FIG. 11 is a circuit diagram showing a state in which write operation is performed in the fifth embodiment.
Figure 12:
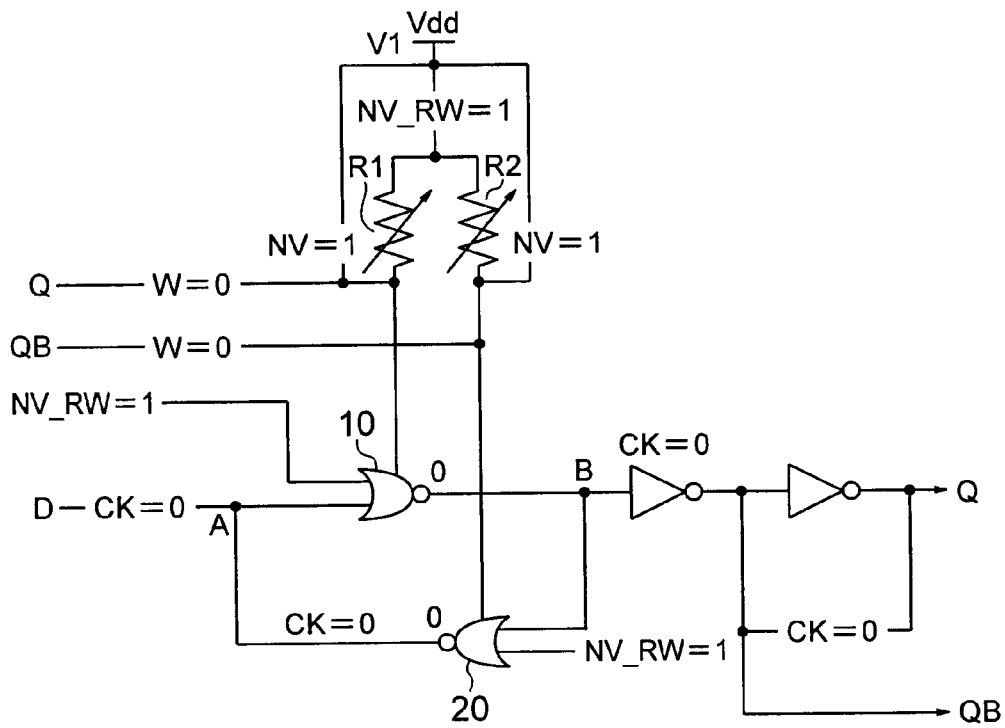
FIG. 12 is a circuit diagram showing a state in which precharge operation is performed in the fifth embodiment.

Specific operation will now be described. The nonvolatile D flip-flop assumes a state shown in FIG. 10 when the control signals NV_RW=0, NV=0 and W=0, and functions as a D flip-flop similar to the conventional D flip-flop.

When storing the current data, the control signals are set to NV_RW=1, NV=1, CK=1 and W=1. In this state, currents in opposite directions flow through the spin injection type MTJ elements R1 and R2 according to the value of the output data Q, and resistance values of the spin injection type MTJ elements R1 and R2 change to different values. Since the resistance values are retained by the nonvolatility of the spin injection type MTJ elements, data is not lost even if the power supply of the flip-flop is intercepted. Since the write operation is performed when CK=1 in this case, it is possible to compose W by using the control signals NV and CK.

Operation of reading out stored data is performed in two stages 1) precharge operation and 2) read operation after power is turned on.

First, as 1) precharge operation, the control signals are set to NV_RW=0, NV=1, CK=0 and W=0. In this state, the outputs of the logic circuits 10 and 20 become "0." Both nodes A and B of the cross-coupled logic circuits 10 and 20 are precharged to "0" equally.

Figure 13:
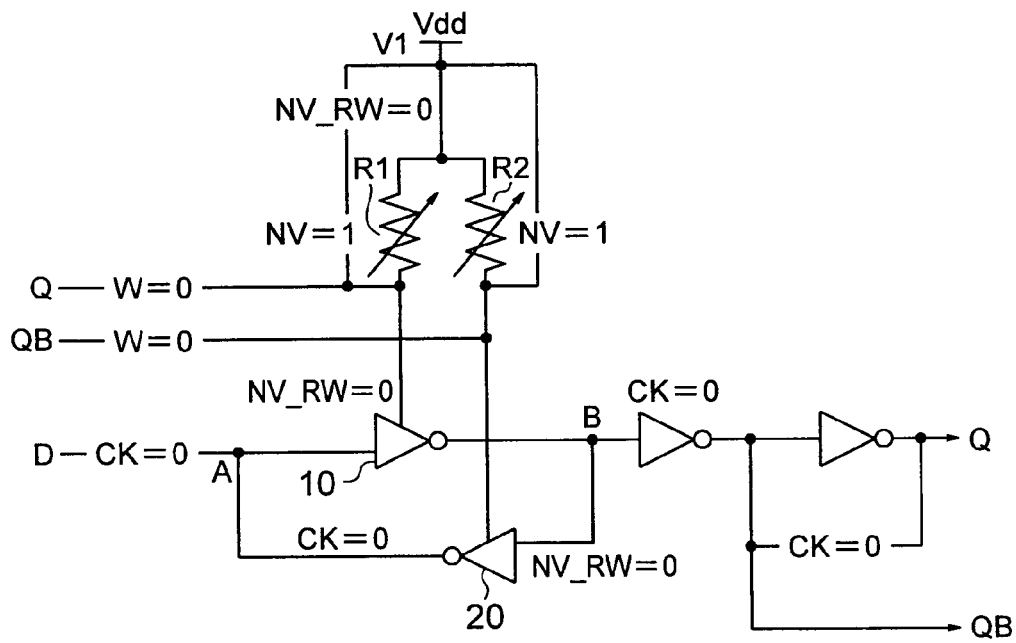
FIG. 13 is a circuit diagram showing a state in which read operation is performed in the fifth embodiment.

Subsequently, as 2) the read operation, the control signal NV_RW is changed in state from "1" to "0" as shown in FIG. 13. Thereupon, the cross-coupled logic circuits 10 and 20 perform operation of the cross-coupled inverters. The values of the nodes A and B are determined to be "1" or "0" by a difference between delays depending upon the resistance values of the spin injection type MTJ elements R1 and R2. The values of the nodes A and B correspond to the stored states QB and Q. Values read out are latched on the slave side.

As heretofore described, the present embodiment has the spin injection type MTJ elements as the nonvolatile memory elements. As a result, the nonvolatile flip-flop circuit which is excellent in scalability even if it is made fine can be obtained. In addition, the data writing is not performed every clock period, but performed on the basis of the control signal. Therefore, high endurance becomes unnecessary.

Sixth Embodiment

Figure 14:
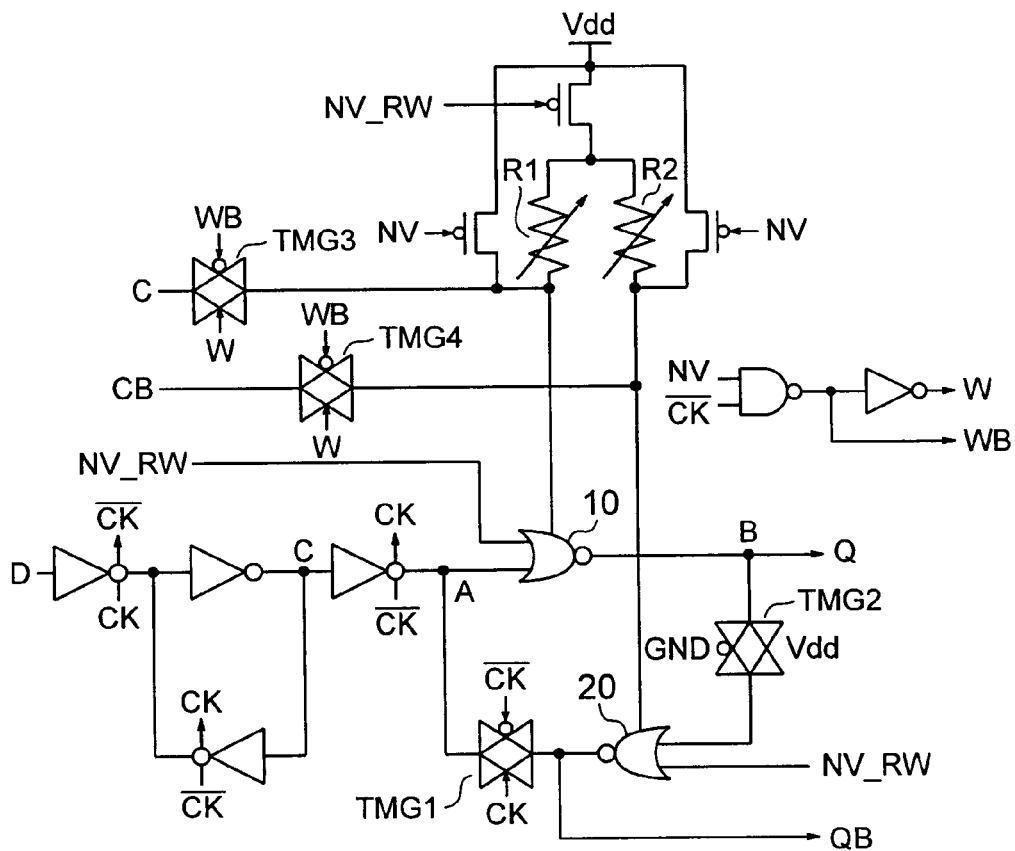
FIG. 14 is a circuit diagram showing a nonvolatile flip-flop circuit according to a sixth embodiment.

A nonvolatile flip-flop circuit according to a sixth embodiment of the present invention is shown in FIG. 14. The nonvolatile flip-flop circuit according to the present embodiment has a configuration obtained by replacing the D latch on the slave side in the master-slave D flip-flop with the nonvolatile latch circuit according to the third embodiment shown in FIG. 7. In this case, nodes for writing are not Q and QB, but C and D are used.

As heretofore described, the present embodiment has the spin injection type MTJ elements as the nonvolatile memory elements. As a result, the nonvolatile flip-flop circuit which is excellent in scalability even if it is made fine can be obtained. In addition, the data writing is not performed every clock period, but performed on the basis of the control signal. Therefore, high endurance becomes unnecessary.

Seventh Embodiment

Figure 15:
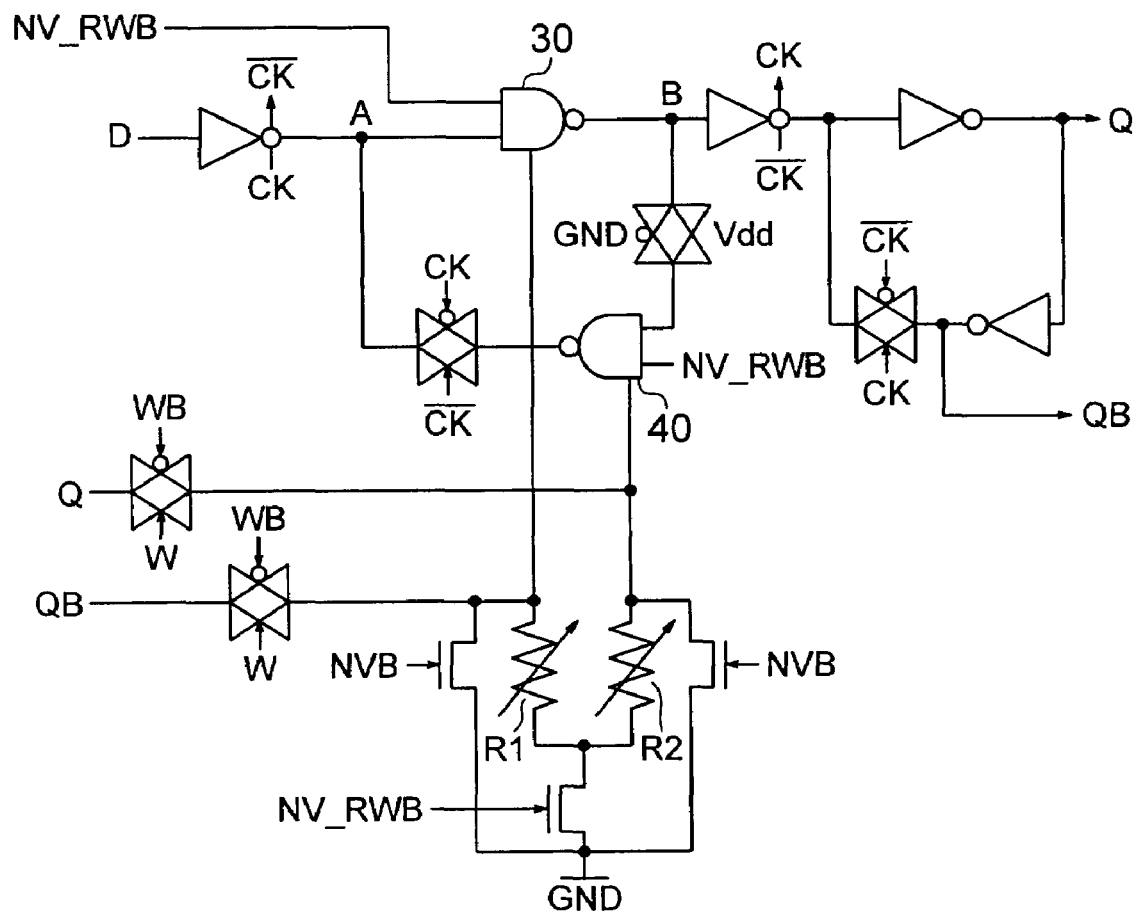
FIG. 15 is a circuit diagram showing a nonvolatile flip-flop circuit according to a seventh embodiment.

A nonvolatile flip-flop circuit according to a seventh embodiment of the present invention is shown in FIG. 15. The nonvolatile flip-flop circuit according to the present embodiment has a configuration obtained by replacing the D latch on the master side in the master-slave D flip-flop with the nonvolatile latch circuit according to the fourth embodiment shown in FIG. 8.

As heretofore described, the present embodiment has the spin injection type MTJ elements as the nonvolatile memory elements. As a result, the nonvolatile flip-flop circuit which is excellent in scalability even if it is made fine can be obtained. In addition, the data writing is not performed every clock period, but performed on the basis of the control signal. Therefore, high endurance becomes unnecessary.

Eighth Embodiment

Figure 16:
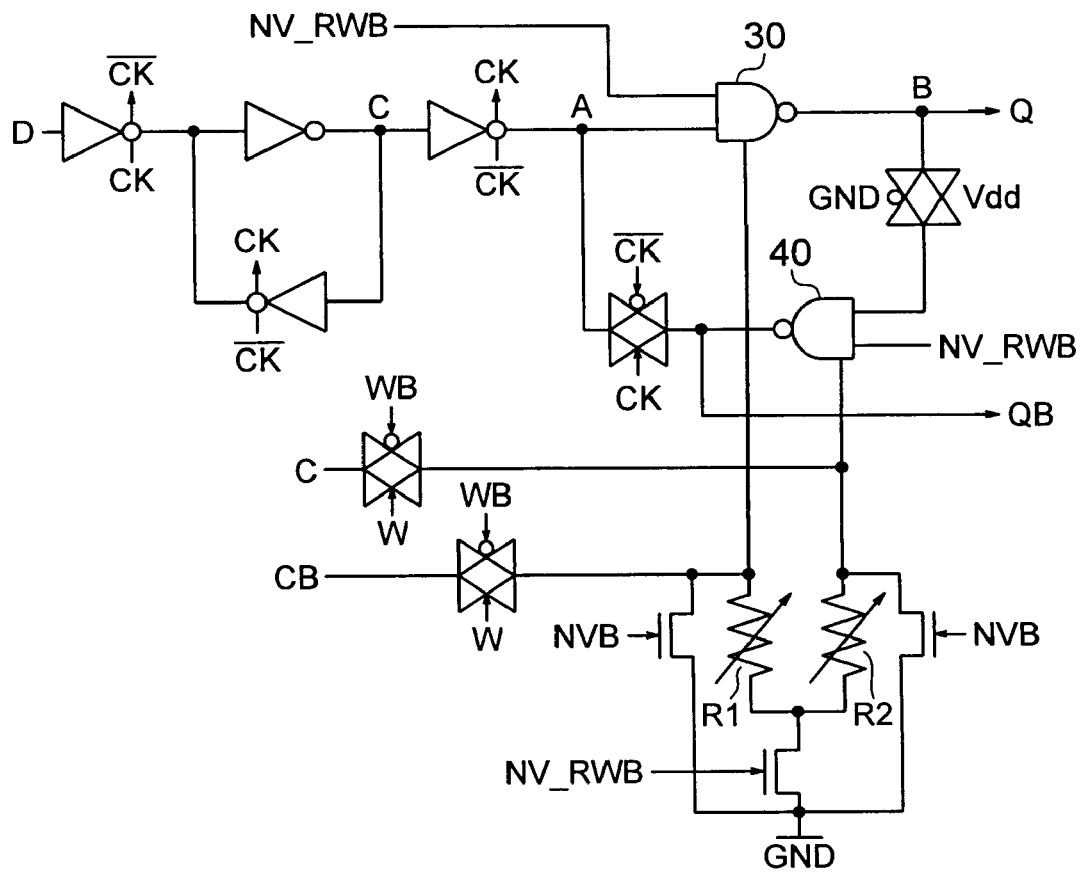
FIG. 16 is a circuit diagram showing a nonvolatile flip-flop circuit according to an eighth embodiment.

A nonvolatile flip-flop circuit according to an eighth embodiment of the present invention is shown in FIG. 16. The nonvolatile flip-flop circuit according to the present embodiment has a configuration obtained by replacing the D latch on the slave side in the master-slave D flip-flop with the nonvolatile latch circuit according to the fourth embodiment shown in FIG. 8.

As heretofore described, the present embodiment has the spin injection type MTJ elements as the nonvolatile memory elements. As a result, the nonvolatile flip-flop circuit which is excellent in scalability even if it is made fine can be obtained. In addition, the data writing is not performed every clock period, but performed on the basis of the control signal. Therefore, high endurance becomes unnecessary.

Ninth Embodiment

Figure 17:
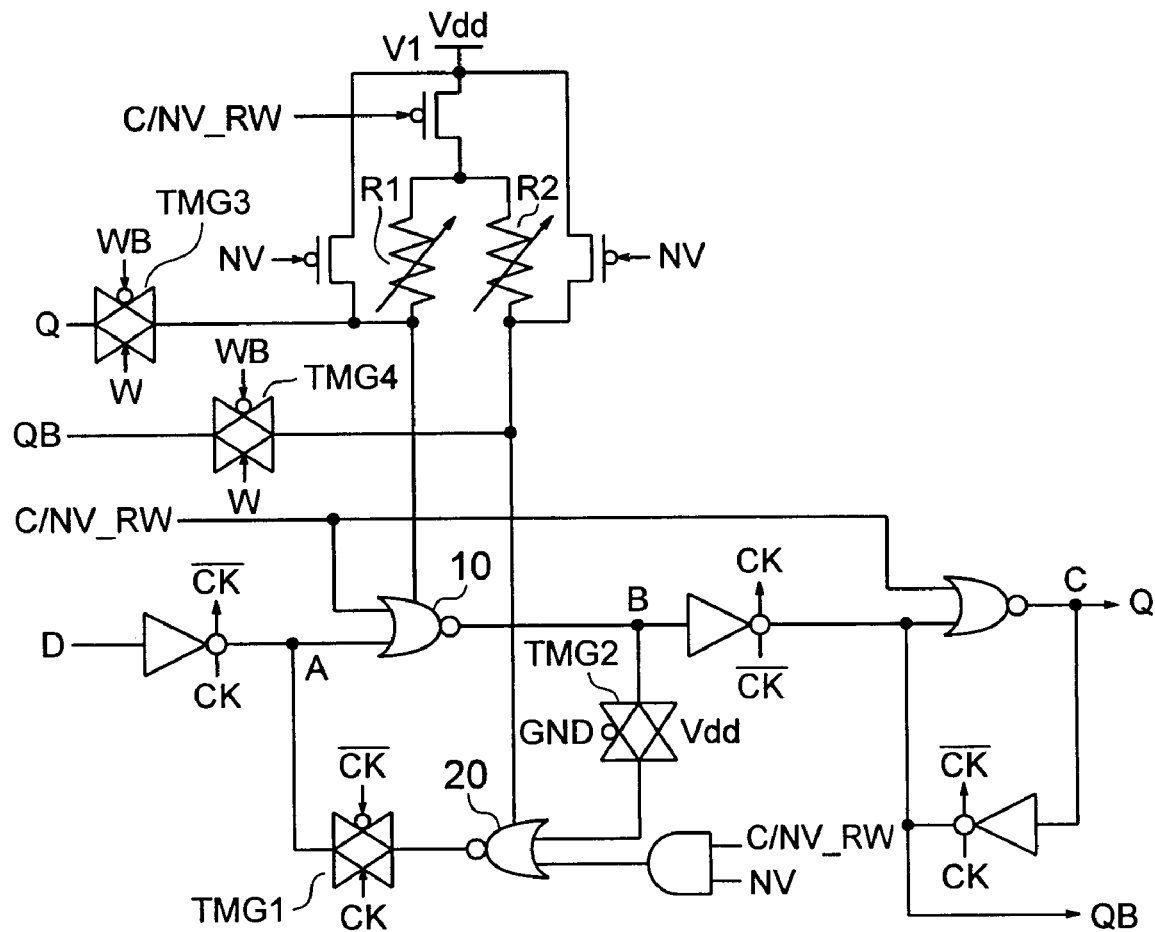
FIG. 17 is a circuit diagram showing a nonvolatile flip-flop circuit according to a ninth embodiment.

A nonvolatile flip-flop circuit according to a ninth embodiment of the present invention is shown in FIG. 17. The nonvolatile flip-flop circuit according to the present embodiment has a configuration using the nonvolatile latch circuit according to the third embodiment shown in FIG. 7 as a component of a flip-flop having a clear terminal.

In this case, NV_RW and a clear signal can be combined into a common line C/NV_RW, and an increase of signal lines can be held down.

As heretofore described, the present embodiment has the spin injection type MTJ elements as the nonvolatile memory elements. As a result, the nonvolatile flip-flop circuit which is excellent in scalability even if it is made fine can be obtained. In addition, the data writing is not performed every clock period, but performed on the basis of the control signal. Therefore, high endurance becomes unnecessary.

Tenth Embodiment

Figure 18:
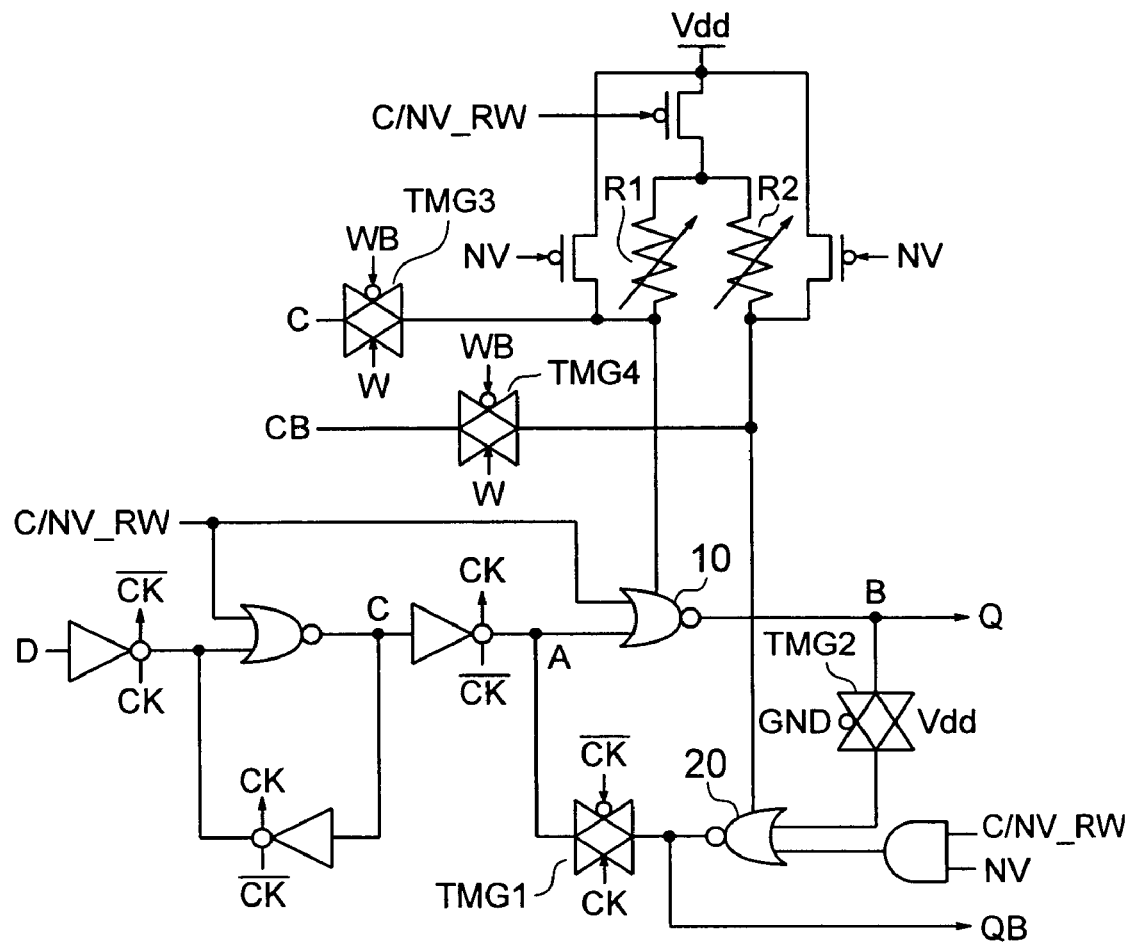
FIG. 18 is a circuit diagram showing a nonvolatile flip-flop circuit according to a tenth embodiment.

A nonvolatile flip-flop circuit according to a tenth embodiment of the present invention is shown in FIG. 18. The nonvolatile flip-flop circuit according to the present embodiment has a configuration using the nonvolatile latch circuit according to the fourth embodiment shown in FIG. 8 as a component of a flip-flop having a clear terminal.

In this case, NV_RW and a clear signal can be combined into a common line C/NV_RW, and an increase of signal lines can be held down.

As heretofore described, the present embodiment has the spin injection type MTJ elements as the nonvolatile memory elements. As a result, the nonvolatile flip-flop circuit which is excellent in scalability even if it is made fine can be obtained. In addition, the data writing is not performed every clock period, but performed on the basis of the control signal. Therefore, high endurance becomes unnecessary.

Eleventh Embodiment

Figure 19:
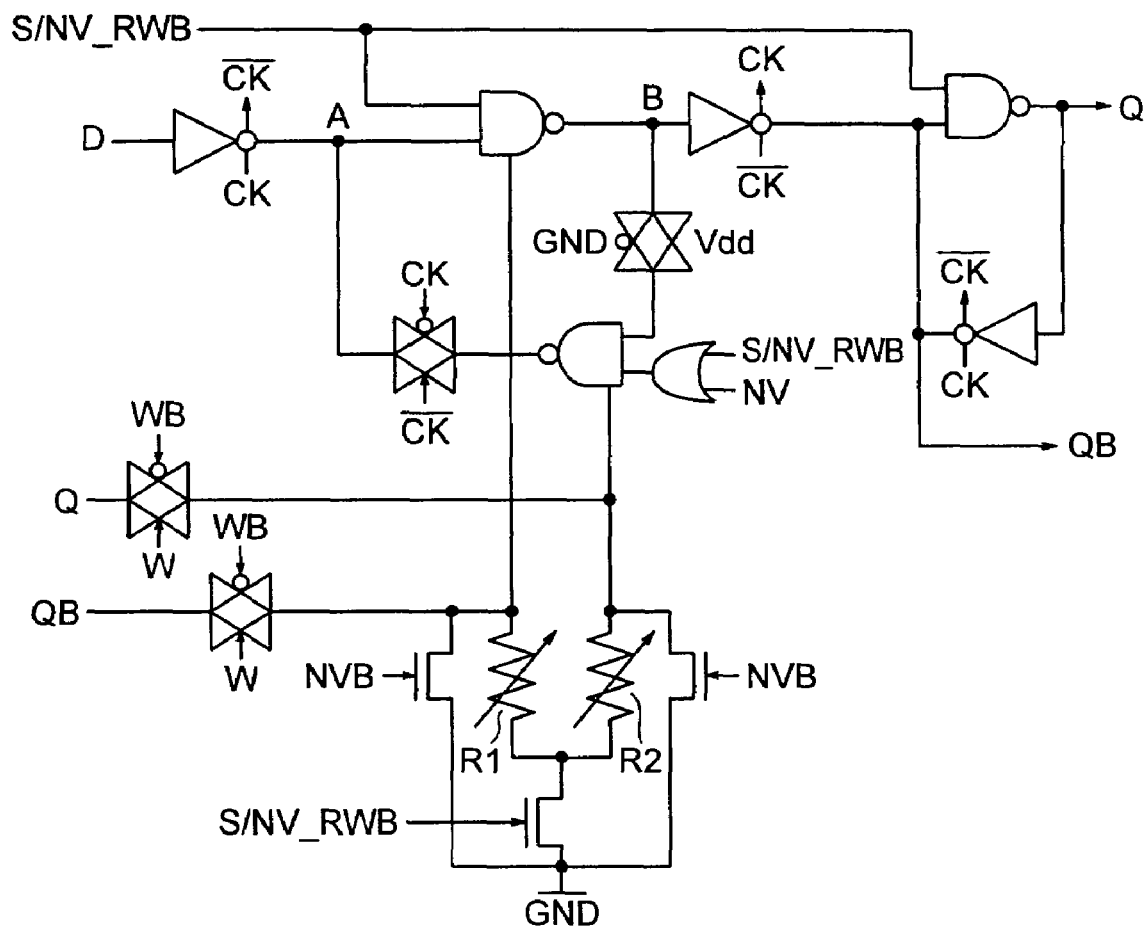
FIG. 19 is a circuit diagram showing a nonvolatile flip-flop circuit according to an eleventh embodiment.

A nonvolatile flip-flop circuit according to an eleventh embodiment of the present invention is shown in FIG. 19. The nonvolatile flip-flop circuit according to the present embodiment has a configuration using the nonvolatile latch circuit according to the third embodiment shown in FIG. 7 as a component of a flip-flop having a set terminal.

In this case, NV_RW and a set signal can be combined into a common line S/NV_RW, and an increase of signal lines can be held down.

As heretofore described, the present embodiment has the spin injection type MTJ elements as the nonvolatile memory elements. As a result, the nonvolatile flip-flop circuit which is excellent in scalability even if it is made fine can be obtained. In addition, the data writing is not performed every clock period, but performed on the basis of the control signal. Therefore, high endurance becomes unnecessary.

Twelfth Embodiment

Figure 20:
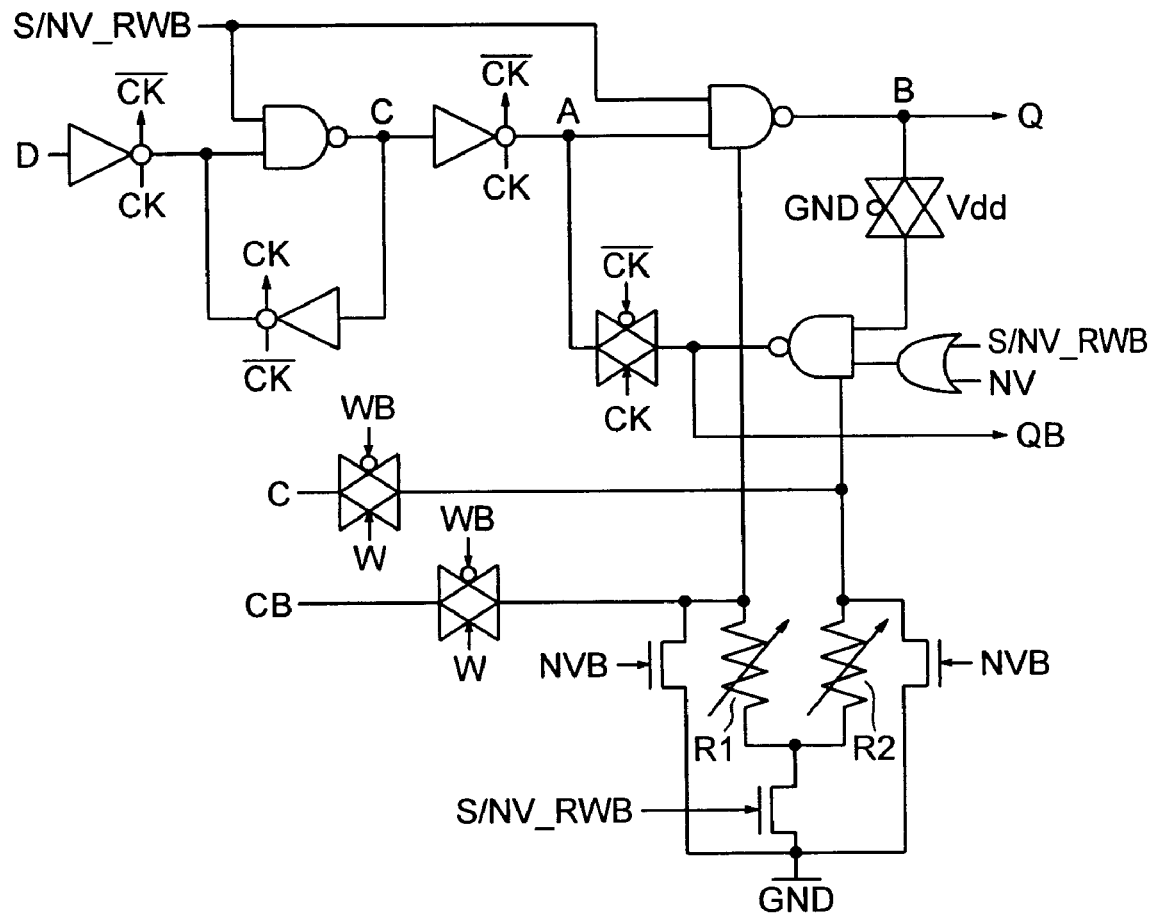
FIG. 20 is a circuit diagram showing a nonvolatile flip-flop circuit according to a twelfth embodiment.

A nonvolatile flip-flop circuit according to a twelfth embodiment of the present invention is shown in FIG. 20. The nonvolatile flip-flop circuit according to the present embodiment has a configuration using the nonvolatile latch circuit according to the fourth embodiment shown in FIG. 8 as a component of a flip-flop having a set terminal.

In this case, NV_RW and a set signal can be combined into a common line S/NV_RW, and an increase of signal lines can be held down.

As heretofore described, the present embodiment has the spin injection type MTJ elements as the nonvolatile memory elements. As a result, the nonvolatile flip-flop circuit which is excellent in scalability even if it is made fine can be obtained. In addition, the data writing is not performed every clock period, but performed on the basis of the control signal. Therefore, high endurance becomes unnecessary.

Thirteenth Embodiment

Figure 21:
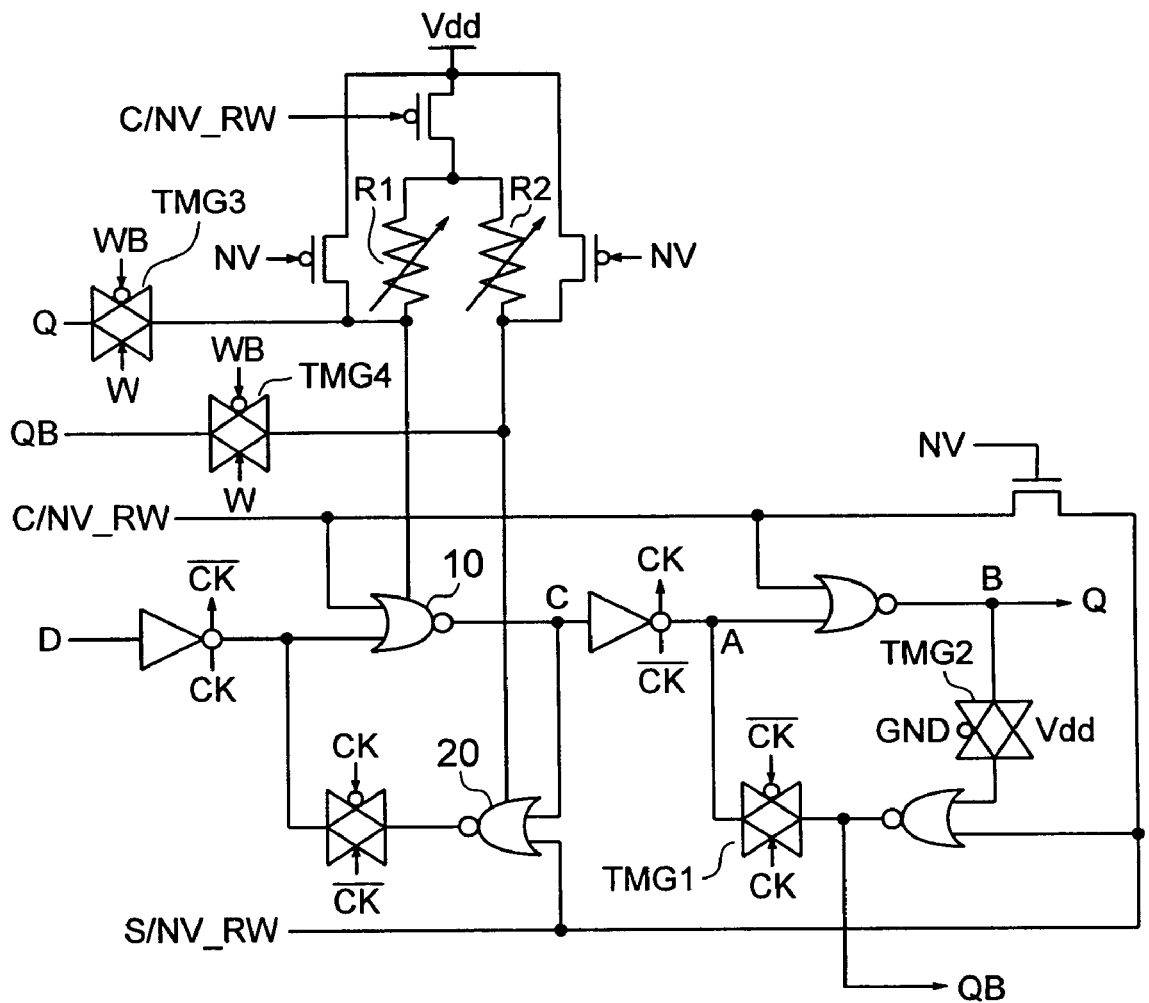
FIG. 21 is a circuit diagram showing a nonvolatile flip-flop circuit according to a thirteenth embodiment.

A nonvolatile flip-flop circuit according to a thirteenth embodiment of the present invention is shown in FIG. 21. The nonvolatile flip-flop circuit according to the present embodiment has a configuration using the nonvolatile latch circuit according to the third embodiment shown in FIG. 7 as a component of a flip-flop having a set/clear terminal.

In this case, NV_RW and a clear signal located on the upper side of FIG. 21 can be combined into a common line C/NV_RW, and NV_RW and a set signal located on the lower side of FIG. 21 can be combined into a common line S/NV_RW. As a result, an increase of signal lines can be held down. In order to change the signals C/NV_RW and S/NV_RW at the same timing in readout, both signal lines are short-circuited to each other by using the control signal NV before the read operation. By doing so, the probability of the readout error can be lowered. The method for short-circuiting the signal lines is not restricted to this.

As heretofore described, the present embodiment has the spin injection type MTJ elements as the nonvolatile memory elements. As a result, the nonvolatile flip-flop circuit which is excellent in scalability even if it is made fine can be obtained. In addition, the data writing is not performed every clock period, but performed on the basis of the control signal. Therefore, high endurance becomes unnecessary.

Fourteenth Embodiment

Figure 22:
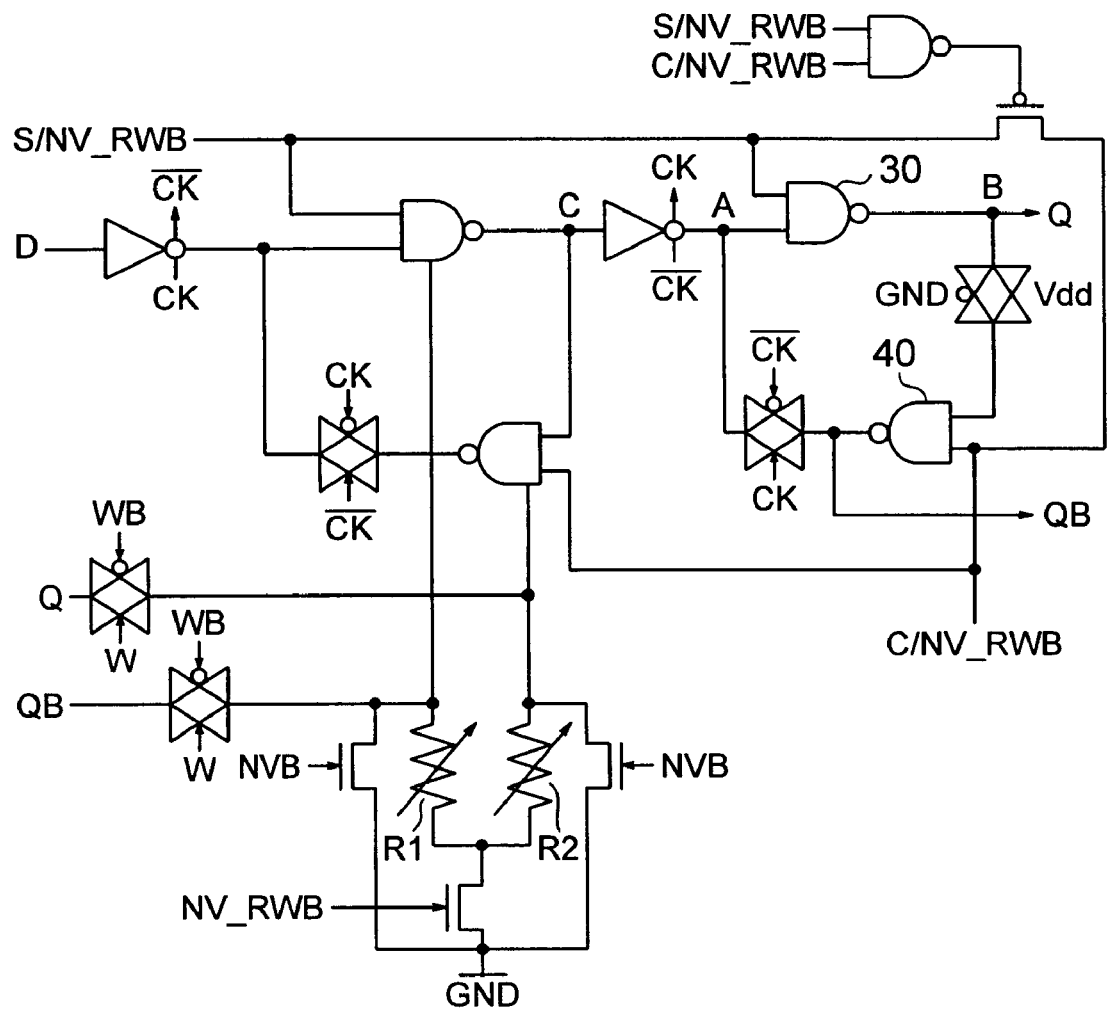
FIG. 22 is a circuit diagram showing a nonvolatile flip-flop circuit according to a fourteenth embodiment.

A nonvolatile flip-flop circuit according to a fourteenth embodiment of the present invention is shown in FIG. 22. The nonvolatile flip-flop circuit according to the present embodiment has a configuration using the nonvolatile latch circuit according to the fourth embodiment shown in FIG. 8 as a component of a flip-flop having a set/clear terminal.

In this case, NV_RW and a clear signal located on the upper side of FIG. 22 can be combined into a common line C/NV_RW, and NV_RW and a set signal located on the lower side of FIG. 22 can be combined into a common line S/NV_RW. As a result, an increase of signal lines can be held down. In order to change the signals C/NV_RW and S/NV_RW at the same timing in readout, both signal lines are short-circuited to each other by using the control signal NV before the read operation. By doing so, the probability of the readout error can be lowered. The method for short-circuiting the signal lines is not restricted to this.

As heretofore described, the present embodiment has the spin injection type MTJ elements as the nonvolatile memory elements. As a result, the nonvolatile flip-flop circuit which is excellent in scalability even if it is made fine can be obtained. In addition, the data writing is not performed every clock period, but performed on the basis of the control signal. Therefore, high endurance becomes unnecessary.

In the first to fourteenth embodiments, spin injection type MTJ elements are used as the nonvolatile memory elements. As long as resistance elements are different in resistance according to the current flow direction, however, they can be used instead of the spin injection type MTJ elements.

According to the embodiments of the present invention, excellent scalability is obtained even if the circuit is made fine and high endurance becomes unnecessary.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A nonvolatile latch circuit comprising:
an input node receiving an input signal;
a first gate part controlling to load or intercept the input signal based on a first gate signal;
a first logic gate connected to a driving power supply and a grounding power supply, and having a first input terminal to receive the input signal and a second input terminal to receive a first control signal, the first logic gate functioning as an inverter or a gate outputting a constant voltage in response to the first control signal;
a second logic gate connected to the driving power supply and the grounding power supply, and having a first input terminal to receive the output of the first logic gate and a second input terminal to receive the first control signal, the second logic gate functioning as an inverter or a gate outputting the constant voltage in response to the first control signal;
a second gate part controlling to load or intercept the output of the second logic gate based on an inverted signal of the first gate signal and sends the output of the second logic gate to the first input terminal of the first logic gate;
a first spin injection type MTJ element provided between the driving power supply and the first logic gate and changing in resistance depending upon a current flow direction;
a second spin injection type MTJ element provided between the driving power supply and the second logic gate and changing in resistance depending upon the current flow direction;
a third gate part having an input terminal to receive a data write signal and an output terminal connected to a node between the first spin injection type MTJ element and the first logic gate, and controlling to load or intercept the data write signal based on a second gate signal different from the first gate signal;
a fourth gate part having an input terminal to receive an inverted signal of the data write signal and an output terminal connected to a node between the second spin injection type MTJ element and the second logic gate, and controlling to load or intercept the inverted signal of the data write signal based on the second gate signal;
a first output node outputting the output of the second logic gate as an output signal;
a second output node outputting the output of the first logic gate as an inverted signal of the output signal; and
a first transistor short-circuiting the first and second spin injection type MTJ elements to the driving power supply based on the first control signal; and
second and third transistors short-circuiting terminals of the first and second logic gates to the driving power supply based on a second control signal.

2. The nonvolatile latch circuit according to claim 1, wherein the first and second logic gates are NOR gates.

3. The nonvolatile latch circuit according to claim 1, further comprising a fifth gate part short-circuiting an output terminal of the first logic gate to the first input terminal of the second logic gate, which has substantially the same size as the second gate part does.

4. The nonvolatile latch circuit according to claim 1, wherein data retained by the first and second spin injection type MTJ elements is reproduced by precharging the first input terminals of the first and second logic gates by means of the first control signal and then changing the first control signal.

5. A nonvolatile flip-flop circuit comprising the nonvolatile latch circuit according to claim 1.

6. The nonvolatile flip-flop circuit according to claim 5, further comprising:
a first transistor short-circuiting the first and second spin injection type MTJ elements to the driving power supply based on the first control signal; and
second and third transistors short-circuiting terminals of the first and second logic gates to the driving power supply based on a second control signal.

7. The nonvolatile flip-flop circuit according to claim 5, wherein the first and second logic gates are NOR gates.

8. The nonvolatile flip-flop circuit according to claim 5, further comprising a fifth gate part short-circuiting an output terminal of the first logic gate to the first input terminal of the second logic gate, which has substantially the same size as the second gate part does.

9. The nonvolatile flip-flop circuit according to claim 5, wherein data retained by the first and second spin injection type MTJ elements is reproduced by precharging the first input terminals of the first and second logic gates by means of the first control signal and then changing the first control signal.

* * * * *